(12) United States Patent
Hayden et al.

(10) Patent No.: US 11,698,554 B2
(45) Date of Patent: Jul. 11, 2023

(54) DISPLAY SYSTEM

(71) Applicant: VISTEON GLOBAL TECHNOLOGIES, INC., Van Buren Township, MI (US)

(72) Inventors: Brian J. Hayden, Royal Oak, MI (US); Andrew F. Rice, Canton, MI (US); Paul Fredrick Luther Weindorf, Novi, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 130 days.

(21) Appl. No.: 17/433,530

(22) PCT Filed: Feb. 24, 2020

(86) PCT No.: PCT/US2020/019494
§ 371 (c)(1),
(2) Date: Aug. 24, 2021

(87) PCT Pub. No.: WO2020/176409
PCT Pub. Date: Sep. 3, 2020

(65) Prior Publication Data
US 2022/0155639 A1 May 19, 2022

Related U.S. Application Data

(63) Continuation-in-part of application No. 16/284,627, filed on Feb. 25, 2019, now Pat. No. 11,256,135.
(Continued)

(51) Int. Cl.
*G02F 1/13357* (2006.01)
*G02F 1/1335* (2006.01)

(52) U.S. Cl.
CPC .. *G02F 1/133606* (2013.01); *G02F 1/133536* (2013.01); *G02F 1/133603* (2013.01); *G02F 1/133601* (2021.01); *G02F 1/133611* (2013.01)

(58) Field of Classification Search
CPC ......... G02F 1/133606; G02F 1/133536; G02F 1/133603; G02F 1/133611
(Continued)

(56) References Cited

U.S. PATENT DOCUMENTS

| 5,299,039 A | 3/1994 | Bohannon |
| 5,686,979 A | 11/1997 | Weber et al. |

(Continued)

FOREIGN PATENT DOCUMENTS

| JP | 2010134269 A | 6/2010 |
| WO | 2009107536 A1 | 9/2009 |
| WO | 2011162133 A1 | 12/2011 |

OTHER PUBLICATIONS

Panasonic Develops Industry's First IPS Liquid Crystal Panel with Contrast Ration of over 1,000,000:1, Panasonic Corporation Press Release, Nov. 28, 2016, pp. 1-5, Panasonic Corporation.

*Primary Examiner* — Charles S Chang
(74) *Attorney, Agent, or Firm* — Quinn IP Law

(57) ABSTRACT

A power reduced display includes a light source having an available space and configured to generate a backlight, a first display having multiple first pixels, wherein each first pixel is configured to selectively pass and block the backlight, a second display having multiple second pixels. The light source includes a first number of first packages each having a single light-emitting diode. The first number is a largest number of the first packages that fit in the available space of the light source. The first number of the first packages is configured to consume a first power to produce a particular luminance. A second number of second packages each having two light-emitting diodes alternatively fit in the available space and is configured to consume a second power to produce the particular luminance. The first number is greater than the second number. The first power is less than the second power.

20 Claims, 14 Drawing Sheets

Related U.S. Application Data

(60) Provisional application No. 62/958,014, filed on Jan. 7, 2020.

(58) Field of Classification Search
USPC .......................................... 349/61–68, 73–75
See application file for complete search history.

(56) References Cited

U.S. PATENT DOCUMENTS

| | | |
|---|---|---|
| 5,818,522 A | 10/1998 | Sato |
| 7,106,396 B2 | 9/2006 | Suzuki |
| 7,268,841 B2 | 9/2007 | Kasajima et al. |
| 7,495,719 B2 | 2/2009 | Adachi et al. |
| 7,916,223 B2 | 3/2011 | Kitagawa et al. |
| 8,045,098 B2 | 10/2011 | Kitagawa et al. |
| 8,248,555 B2 | 8/2012 | Senoue et al. |
| 8,482,698 B2 | 7/2013 | Atkins |
| 8,672,493 B2 | 3/2014 | Tsuda et al. |
| 8,891,042 B1 | 11/2014 | Osterman et al. |
| 9,329,430 B2 | 5/2016 | Erinjippurath et al. |
| 9,535,280 B2 | 1/2017 | Borrelli et al. |
| 9,684,204 B2 | 6/2017 | Sakai et al. |
| 9,772,530 B2 | 9/2017 | Gilbert |
| 9,860,516 B2 | 1/2018 | Hamashima et al. |
| 9,864,243 B2 | 1/2018 | Erinjippurath et al. |
| 10,056,022 B2 | 8/2018 | Bonnier et al. |
| 10,191,337 B2 | 1/2019 | Ono |
| 10,310,346 B2 | 6/2019 | Kim et al. |
| 2004/0218118 A1 | 11/2004 | Hayashi |
| 2005/0088401 A1 | 4/2005 | Daly |
| 2006/0191177 A1 | 8/2006 | Engel |
| 2008/0007486 A1 | 1/2008 | Fujinawa et al. |
| 2008/0225512 A1 | 9/2008 | Roberts et al. |
| 2009/0189543 A1 | 7/2009 | Yeo et al. |
| 2009/0243504 A1 | 10/2009 | Cho et al. |
| 2009/0284518 A1 | 11/2009 | Sawabe |
| 2009/0303419 A1 | 12/2009 | Koma |
| 2011/0141154 A1 | 6/2011 | Ahn et al. |
| 2011/0164207 A1 | 7/2011 | Arai et al. |
| 2012/0274878 A1 | 11/2012 | Kunz et al. |
| 2013/0076704 A1 | 3/2013 | Song et al. |
| 2013/0141668 A1 | 6/2013 | Washio et al. |
| 2013/0335682 A1 | 12/2013 | Gilbert et al. |
| 2014/0293188 A1 | 10/2014 | Casebolt et al. |
| 2015/0198834 A1 | 7/2015 | Wu et al. |
| 2016/0004137 A1 | 1/2016 | Sagardoyburu |
| 2016/0062023 A1 | 3/2016 | Itoh et al. |
| 2016/0119613 A1 | 4/2016 | Smith |
| 2016/0170702 A1 | 6/2016 | Jiang et al. |
| 2016/0372058 A1 | 12/2016 | Wang et al. |
| 2017/0031206 A1 | 2/2017 | Broughton et al. |
| 2018/0011365 A1 | 1/2018 | Shields et al. |
| 2018/0031897 A1 | 2/2018 | Imaoku et al. |
| 2018/0120634 A1 | 5/2018 | Chen |
| 2018/0275445 A1* | 9/2018 | Katagiri ............ G02F 1/133305 |
| 2018/0341132 A1 | 11/2018 | Suzuki |
| 2019/0129213 A1 | 5/2019 | Cho et al. |
| 2019/0171045 A1 | 6/2019 | Masuda |

\* cited by examiner

| LEDs | KW DPLS33.KD 1 chip | KW DPLS32.KD 2 chip | |
|---|---|---|---|
| System Power | 14.5 | ← | W |

LED Datasheet Values

| | | | |
|---|---|---|---|
| $V_{LED}$ | 2.95 | 6.05 | V (typical) |
| Ref mA | 120 | 100 | mA (binning current) |
| Luminous Flux | 48.6 | 72.3 | lm (overall mid bin value) |
| Max $T_{op}$ | 100 | 110 | °C (operating) |
| Eval Temp | 100 | ← | |
| Max $I_{LED}$ | 200.0 | 95.0 | mA @ 100 °C (operating) |

32 LED Analysis

| | | | |
|---|---|---|---|
| No LEDs | 32 | ← | |
| $P_{LED}$ | 453.1 | ← | mW; (14.5 W / 32 LEDs) |
| $I_{LED}$ | 146.7 | 76.0 | mA |
| $V_F$ | 3.09 | 5.96 | V; ($V_F$ vs mA) |
| $P_{LED}$ | 453.1 | 453.1 | mW; ($V_F \times I_{LED}$) |
| $P_{TOT}$ | 14.5 | 14.5 | W; (32 LEDs) $P_{TOT}$ maintained for each scenario |
| Rel Flux | 1.191 | 0.779 | Φ/Φ(n.n mA) |
| LED Flux | 57.9 | 56.3 | lm (ea LED) |
| Total Flux | 1,853 | 1,802 | lm (32 LEDs) |

48 LED Analysis

| | | | |
|---|---|---|---|
| No LEDs | 48 | ← | |
| $P_{LED}$ | 302.1 | ← | mW; (14.5 W / 48 LEDs) |
| $I_{LED}$ | 102.8 | 52.6 | mA |
| $V_F$ | 2.94 | 5.75 | V; ($V_F$ vs mA) |
| $P_{LED}$ | 302.1 | 302.1 | mW; ($V_F \times I_{LED}$) |
| $P_{TOT}$ | 14.5 | 14.5 | W; (48 LEDs) $P_{TOT}$ maintained for each scenario |
| Rel Flux | 0.861 | 0.553 | Φ/Φ(n.n mA) |
| LED Flux | 41.8 | 39.9 | lm (ea LED) |
| Total Flux | 2,008 | 1,916 | lm (48 LEDs) |

*Luminous Efficiency Data (Constant Power)*

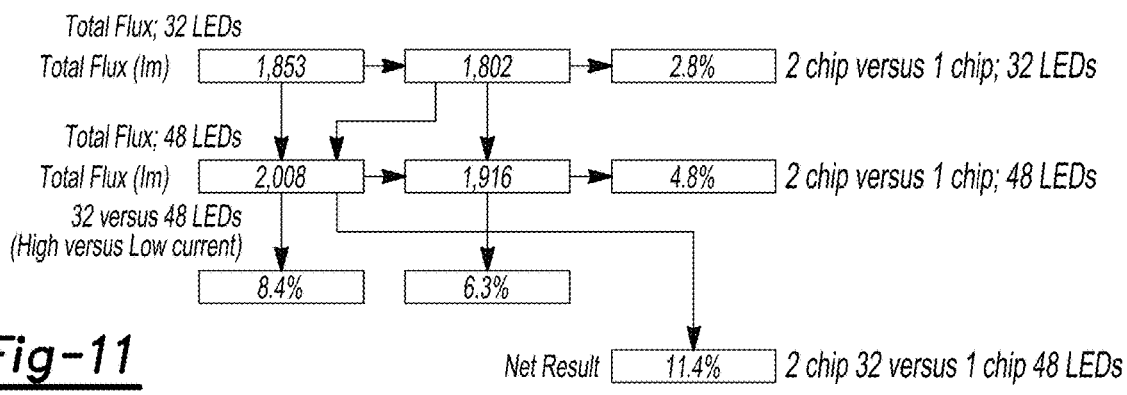

Fig-11

DISPLAY SYSTEM

CROSS-REFERENCE TO RELATED APPLICATIONS

This application is a Continuation-In-Part of U.S. Ser. No. 16/284,627, filed Feb. 25, 2019, and claims the benefit U.S. Provisional Application No. 62/958,014, filed Jan. 7, 2020, each of which are hereby incorporated by reference in their entirety.

TECHNICAL FIELD

The present disclosure generally relates to a display system. In one or more embodiments, the display system includes two or more cells and a light source. The two or more cells may include a first display unit and a second display unit. The display system may utilize a backlight light-emitting diode (LED) power reduction method to increase contrast ratio performance while reducing power consumption. The display system, for example, may be within an electronic instrument panel of a vehicle.

BACKGROUND

A conventional vehicle includes an instrument panel. The instrument panels may include clusters of gauges and one or more displays, with each presenting operationally relevant information to a user. An instrument panel may be positioned within the user's field of view. The individual gauges and displays are configured to convey particular pieces of information, such as a remaining fuel level, a current speed and heading, and an ambient, external, and/or component-level temperature.

Conventional displays used in the instrument panel may include zone backlighting to increase a contrast ratio between white areas and black areas. The zone backlighting typically results in a reduction of the backlight intensity. Therefore, the higher contrast ratio is typically associated with a higher backlighting power.

SUMMARY

This section provides a general summary of the disclosure and is not a comprehensive disclosure of its full scope or all of its features, aspects or objectives.

A display system is provided herein. The display system includes a light source, a first display and a second display. The light source has an available space and is configured to generate a backlight. The first display is aligned with the light source and includes a plurality of first pixels. Each of the plurality of first pixels is configured to selectively pass and block the backlight. The second display is aligned with the first display and includes a plurality of second pixels.

The light source includes a first number of first packages each having a single light-emitting diode. The first number is a largest number of the first packages that fit in the available space of the light source. The first number of the first packages is configured to consume a first power to produce a particular luminance. A second number of second packages each having two light-emitting diodes alternatively fit in the available space of the light source and is configured to consume a second power to produce the particular luminance. The first number is greater than the second number. The first power is less than the second power.

In one or more embodiments, the display system includes a backlight light pipe configured to distribute the backlight received from the light source to the first display.

In one or more embodiments of the display system, the light source is configured to present the backlight to a single side of the backlight light pipe.

In one or more embodiments of the display system, the first packages are arranged in a plurality of first strings, and the second packages are arranged in a plurality of second strings.

In one or more embodiments of the display system, each of the plurality of first strings is configured to use a first current and each of the plurality of second strings is configured to use a second current, wherein the first current is greater than the second current.

In one or more embodiments of the display system, each of the plurality of first strings is configured to yield a first voltage across and each of the plurality of second strings is configured to yield a second voltage, wherein the first voltage is less than the second voltage.

In one or more embodiments of the display system, at the particular luminance, each of the first packages is configured to yield a first junction temperature, and each of the second packages is configured to yield a second junction temperature, wherein the first junction temperature is lower than the second junction temperature.

In one or more embodiments of the display system, the first number of first packages is configured to increase an efficiency of the first packages as the first junction temperature decreases.

In one or more embodiments of the display system, the first display is a monochrome display and the plurality of first pixels are a plurality of monochrome pixels.

In one or more embodiments of the display system, the second display is a color display and the plurality of second pixels are a plurality of color pixels.

An instrument panel is provided herein. The instrument panel includes an electronic control unit and a plurality of displays in electrical communication with the electronic control unit. One or more of the plurality of displays includes a light source having an available space and configured to generate a backlight and a monochrome display aligned with the light source and having a plurality of monochrome pixels. Each of the plurality of monochrome pixels is configured to selectively pass and block the backlight. A color display is aligned with the monochrome display and having a plurality of color pixels.

The light source includes a first number of first packages each having a single light-emitting diode, the first number is a largest number of the first packages that fit in the available space of the light source, and the first number of the first packages is configured to consume a first power to produce a particular luminance. A second number of second packages each having two light-emitting diodes alternatively fit in the available space of the light source and is configured to consume a second power to produce the particular luminance. The first number is greater than the second number. The first power is less than the second power.

In one or more embodiments of the instrument panel, the one or more of the plurality of displays includes a backlight light pipe configured to distribute the backlight received from the light source to the monochrome display.

In one or more embodiments of the instrument panel, the light source is configured to present the backlight to a single side of the backlight light pipe.

In one or more embodiments of the instrument panel, the first packages are arranged in a plurality of first strings, and the second packages are arranged in a plurality of second strings.

In one or more embodiments of the instrument panel, each of the plurality of first strings is configured to use a first current and each of the plurality of second strings is configured to use a second current, wherein the first current is greater than the second current.

In one or more embodiments of the instrument panel, each of the plurality of first strings is configured to yield a first voltage and each of the plurality of second strings is configured to yield a second voltage, wherein the first voltage is less than the second voltage.

In one or more embodiments of the instrument panel, at the particular luminance, each of the first packages is configured to yield a first junction temperature, and each of the second packages is configured to yield a second junction temperature, wherein the first junction temperature is lower than the second junction temperature.

In one or more embodiments of the instrument panel, the first number of first packages is configured to increase an efficiency of the first packages as the first junction temperature decreases.

In one or more embodiments of the instrument panel, the electronic control unit and the plurality of displays are mountable in a vehicle.

A display system is provided herein. The display system includes a light source, a backlight light pipe, a display, a first number of first packages and a second number of second packages. The light source has an available space and configured to generate a backlight. The backlight light pipe is configured to distribute the backlight received from the light source. The display is aligned with the backlight light pipe and is configured to transmit the backlight received from the backlight light pipe.

The first number of first packages each have a single light-emitting diode and is configured to consume a first power to produce a particular luminance. The second number of second packages each have two light-emitting diodes and is configured to consume a second power to produce the particular luminance. The second number of second packages is replaced by the first number of first packages in the available space of the light source. The first number is greater than the second number. The first power is less than the second power.

The above features and advantages and other features and advantages of the present teachings are readily apparent from the following detailed description of the best modes for carrying out the teachings when taken in connection with the accompanying drawings.

BRIEF DESCRIPTION OF THE DRAWINGS

FIG. 11 illustrates a chart of a constant power analysis in accordance with one or more embodiments of the platform.

Figure 1:
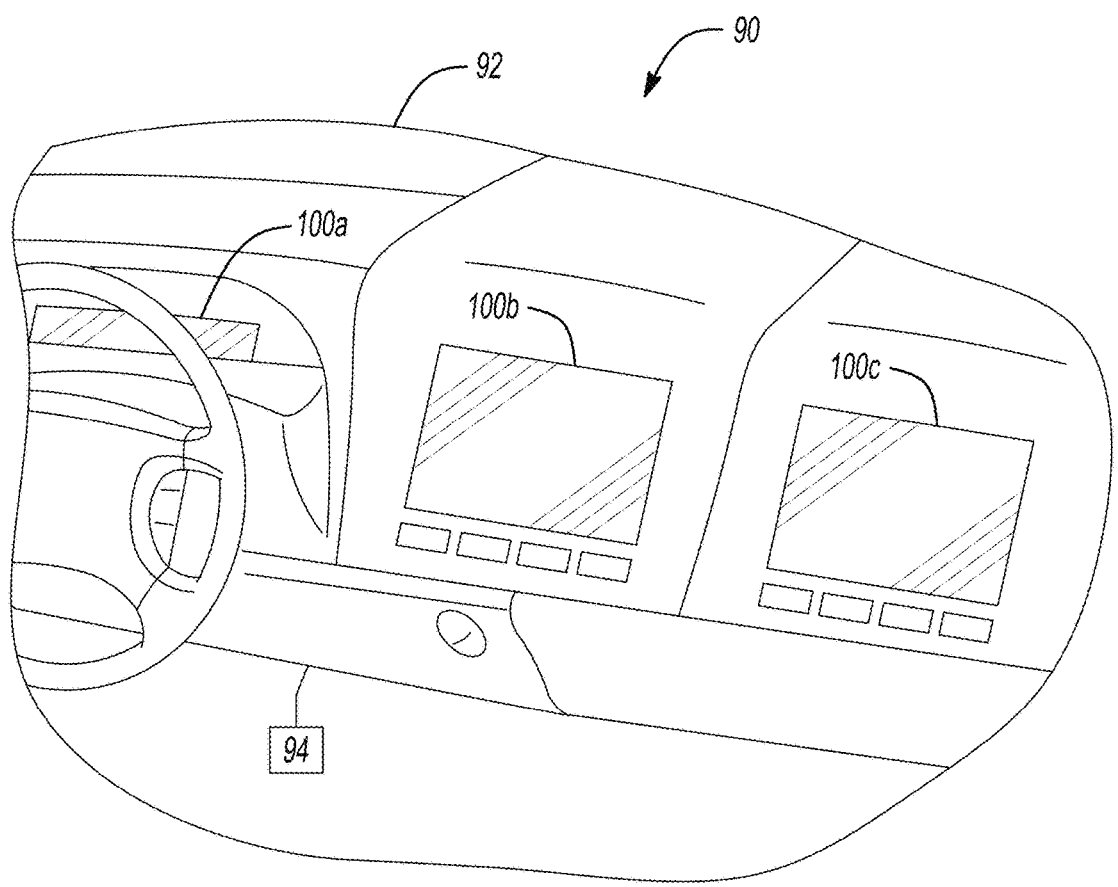
FIG. 1 illustrates a context of a platform.

The present disclosure may have various modifications and alternative forms, and some representative embodiments are shown by way of example in the drawings and will be described in detail herein. Novel aspects of this disclosure are not limited to the particular forms illustrated in the above-enumerated drawings. Rather, the disclosure is to cover modifications, equivalents, and combinations falling within the scope of the disclosure.

DETAILED DESCRIPTION

Those having ordinary skill in the art will recognize that terms such as "above," "below," "front," "back," "upward," "downward," "top," "bottom," etc., may be used descriptively herein without representing limitations on the scope of the disclosure. Furthermore, the present teachings may be described in terms of functional and/or logical block components and/or various processing steps. Such block components may be comprised of various hardware components, software components executing on hardware, and/or firmware components executing on hardware FIG. 1 illustrates a context of a platform 90. The platform 90 generally includes a body 92, an electronic control unit 94 and one or more displays 100a-100c. The body 92 may implement a body of a vehicle. The vehicle may include mobile vehicles such as automobiles, trucks, motorcycles, boats, trains and/or aircraft. In some embodiments, the body 92 may be part of a stationary object. The stationary objects may include, but are not limited to, billboards, kiosks and/or marquees. Other types of platforms 90 may be implemented to meet the design criteria of a particular application.

The electronic control unit 94 may implement one or more display-drive circuits. The electronic control unit 94 is generally operational to generate control signals that drive the displays 100a-100c. In various embodiments, the control signals may be configured to provide instrumentation (e.g. speed, tachometer, fuel, temperature, etc.) to at least one of the displays 100a-100c (e.g., 100a). In some embodiments, the control signals may also be configured to provide video (e.g., a rear-view camera video, a forward-view camera video, an on-board DVD (digital versatile disc) player, etc.) to the displays 100a-100c. In other embodiments, the control signals may be further configured to provide alphanumeric information shown on one or more of the displays 100a-100c.

In various embodiments, the electronic control unit 94 generally comprises at least one microcontroller. The at least one microcontroller may include one or more processors, each of which may be embodied as a separate processor, an application specific integrated circuit (ASIC), a field programmable gate array (FPGA), or a dedicated electronic control unit.

The at least one microcontroller may be any sort of electronic processor (implemented in hardware, software executing on hardware, or a combination of both). The at least one microcontroller may also include tangible, non-transitory memory, (e.g., read only memory in the form of optical, magnetic, and/or flash memory). For example, the at least one microcontroller may include application-suitable amounts of random-access memory, read-only memory, flash memory and other types of electrically-erasable programmable read-only memory, as well as accompanying hardware in the form of a high-speed clock or timer, analog-to-digital and digital-to-analog circuitry, and input/output circuitry and devices, as well as appropriate signal conditioning and buffer circuitry.

Computer-readable and executable instructions embodying the present method may be stored in the memory and executed as set forth herein. The executable instructions may be a series of instructions employed to run applications on the at least one microcontroller (either in the foreground or background). The at least one microcontroller may receive commands and information, in the form of one or more input signals from various controls or components in the platform 90 and communicate instructions to the displays 100a-100c through one or more control signals to control the displays 100a-100c.

The displays 100a-100c are generally mounted to the body 92. In various embodiments, one or more of the displays 100a-100c may be disposed inside the platform (e.g., vehicle) 90. In other embodiments, one or more of the displays 100a-100c may be disposed exterior to the platform 90. One or more of the displays 100a-100c may implement a local dimming backlight capability. As illustrated, the display 100a may be a cluster display positioned for use by a driver. The display 100b may be a console display positioned for use by the driver and a passenger. The display 100c may be a passenger display positioned for use by the passenger. Control signals used to generate images on the displays 100a-100c may be received from the electronic control unit 94. The displays 100a-100c and the electronic control unit 94 may form an instrument panel.

Figure 2:
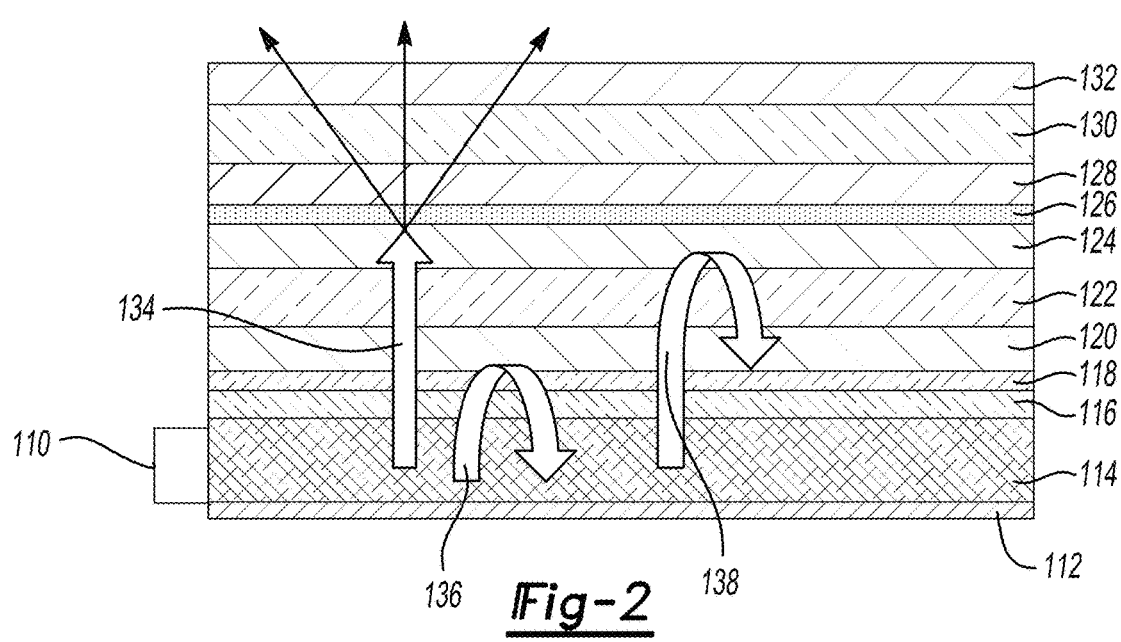
FIG. 2 illustrates a first local-dimming display in accordance with one or more embodiments of the platform.

FIG. 2 illustrates an example embodiment of a first local-dimming display 100x in accordance with one or more embodiments of the platform 90. The first local-dimming display 100x may be representative of each display 100a-100c. The first local-dimming display (or circuit) 100x generally comprises a first light source 110, a rear reflector 112, a backlight light pipe 114, a rear diffuser 116, one or more brightness enhancement films (BEFs) 118, a rear reflective polarizer 120, a monochrome (or first) display 122, a front reflective polarizer 124, a front diffuser 126, a rear linear dye polarizer 128, a color (or second) display 130 and a front linear dye polarizer 132.

The first light source 110 may be implemented as one or more light-emitting diodes (LEDs). The first light source 110 is generally operational to present light into the backlight light pipe 114 along one or more edges. The backlight light pipe 114 is generally operational to spread the light received from the first light source 110 over an area of the first local-dimming display 100x.

Some light presented from the backlight light pipe 114 may be driven-pixel backlight 134 that is passed through the monochrome display 122. Some light may be incorrect-polarization backlight 136 that is recycled back toward the backlight light pipe 114 by the rear reflective polarizer 120. Still other backlight may be an undriven-pixel backlight 138 that may be rotated and reflected back toward the backlight light pipe 114 by the front reflective polarizer 124 for recycling.

Due to developments in current reflective polarizer technology, the two reflective polarizers 120 and 124 may be used in conjunction with the monochrome display 122 (e.g., a monochrome thin-film-transistor display) to produce a local dimming backlight with relatively high optical efficiency. A variation of the optical system may not include the front reflective polarizer 124 and/or the front diffuser 126. Although a system efficiency may be reduced by removing the front reflective polarizer 124, the efficiency of the system may be sufficient with only the rear reflective polarizer 120. Additionally, the front diffuser 126 may be removed if other moiré interference removal methods are utilized thus affording additional improvements in the system efficiency. However, if the front diffuser 126 is removed or reduced in diffusion performance, a Gaussian intensity pattern (or function) or other similar smoothing intensity pattern, may be employed on monochrome (or first) pixels of the monochrome display 122 so that an observer (or user) does not notice a sharp demarcation of the monochrome on-to-off transition behind color (or second) pixels of the color display 130

A basic operating principle is that transmission axes of the two reflective polarizers 120 and 124 are aligned with a transmission axis of the rear linear dye polarizer 128 on the back side of the color display 130 (e.g., a color thin-film-transistor display). The monochrome display 122 may be configured to rotate polarized light by 90 degrees in the undriven state and to not rotate the polarized light in the driven state. In the driven state, polarized light (e.g., the driven-pixel backlight 134) travels through both reflective polarizers 120 and 124 and through the rear linear dye polarizer 128 on the back of the color display 130 to be utilized by the color display 130 to produce a color image.

In the undriven state, the polarized light travelling through the rear reflective polarizer 120 is rotated by 90 degrees by the monochrome display 122. The rotated light (e.g., the undriven-pixel backlight 138) may be reflected by the front reflective polarizer 124 and rotated back into the backlight light pipe 114 through the rear reflective polarizer 120 to be recycled for use. Any light presented by the backlight light pipe 114 that does not have an appropriate polarization (e.g., the incorrect-polarization backlight 136) may be reflected by the rear reflective polarizer 120 back into the backlight light pipe 114.

Since the monochrome display 122 is pixelated, each monochrome pixel may be dynamically configured to either rotate or not rotate the polarized light thereby producing a local dimming backlight at the monochrome pixel level with multiple transmission levels (e.g., $2^N$ transmit levels for an N-bit control per pixel). Using a monochrome display 122 with a lower resolution than the color display 130 may lead to improvements in efficiency because an aperture ratio of the monochrome pixels (or cells) may be improved as the resolution is decreased. If the layers 120-132 are laminated together and aligned at the pixel level, local zones are generally produced by the monochrome display 122 that may be, for instance, larger by a factor (e.g., an integer factor of 2 to 4) than color pixels in the color display 130 to account for alignment tolerances. The factor generally leads to a constrained halo zone that may be difficult to see due to the luminance of the adjacent transmitting monochrome pixel(s).

The front diffuser 126 may reduce moiré effects (e.g., interference patterns) due to intermodulation visual effects of the two thin-film-transistor structures of the monochrome display 122 and the color display 130. However, the front diffuser 126 and/or the rear diffuser 116 may reduce the effective transmission of the first local-dimming display 100x (e.g., by up to 30 percent). Therefore, in various embodiments, the front diffuser 126 and/or the rear diffuser 116 may be eliminated or reduced in diffusion. In some designs, a design of the row and column lines in the monochrome display 122 and the color display 130 may be changed to eliminate the moiré effect. However, the softened edges of the monochrome lit pixels may become sharper and more noticeable due to the change.

The color display 130 generally comprises a matrix of color pixels. The color pixels may be controlled to transmit the light received from the monochrome display 122 at a variety of transmission levels (e.g., $2^N$ transmit levels for an N-bit control per pixel). In various embodiments, the color display 130 may have more color pixels per inch than the monochrome pixels in the monochrome display 122.

Even with the improved optical efficiency with the use of the reflective polarizers 120 and 124 on the monochrome display 122, additional efficiency improvements may be implemented to reduce a backlight power to obtain power performance comparable to the traditional single-color thin-film-transistor approaches. A method to reduce the power in the backlight may be to maximize the number of light-emitting diodes. By maximizing the number of light-emitting diodes, the operational power and associated current is generally reduced for each light-emitting diode resulting in an efficiency improvement. An analysis was performed to estimate the power reduction associated with maximizing the backlight light-emitting diode count.

Figure 3:
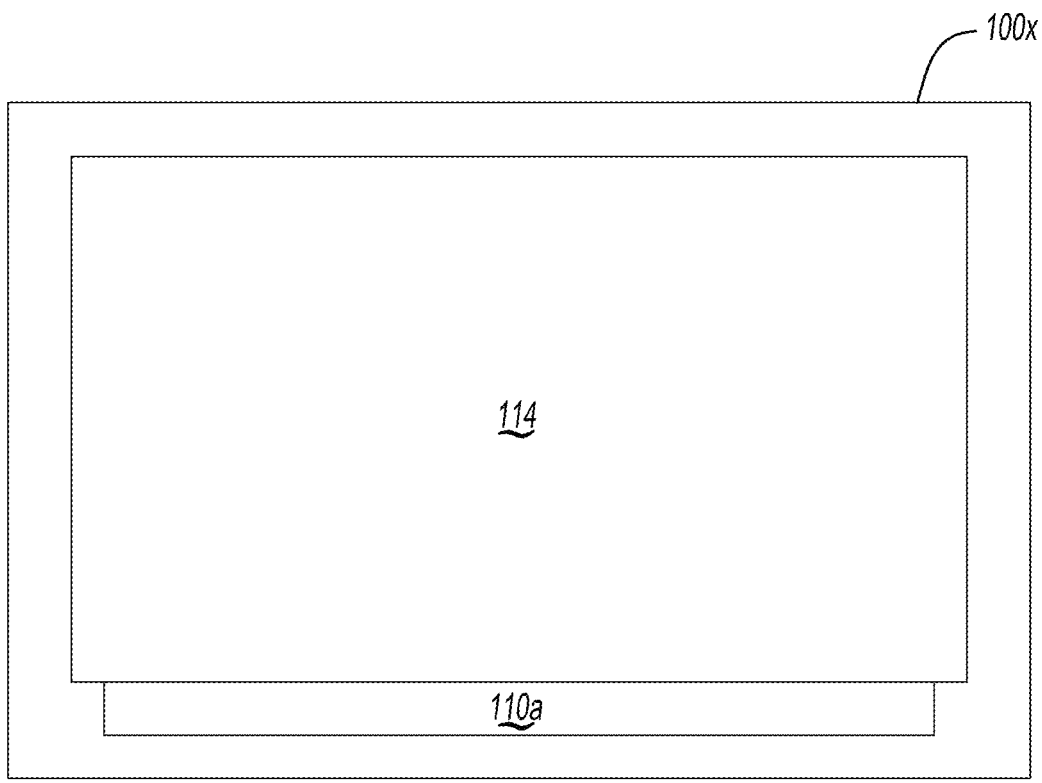
FIG. 3 illustrates a portion the first local-dimming display in accordance with one or more embodiments of the platform.

FIG. 3 illustrates an example implementation of a portion the first local-dimming display 100x in accordance with one or more embodiments of the platform 90. The portion generally comprises a second light source 110a and the backlight light pipe 114. The second light source 110a may be a variation of the first light source 110.

The second light source 110a may be mounted along one side (e.g., a lower side as shown in the figure) of the backlight light pipe 114. The second light source 110a may comprise multiple (e.g., 32) dual-LED packages (or devices) positioned uniformly along the side facing the backlight light pipe 114. The dual-LED packages may generate the backlight that is projected into the backlight light pipe 114. The backlight light pipe 114 may be configured to distribute the backlight over an area facing the monochrome display 122.

Figure 4:
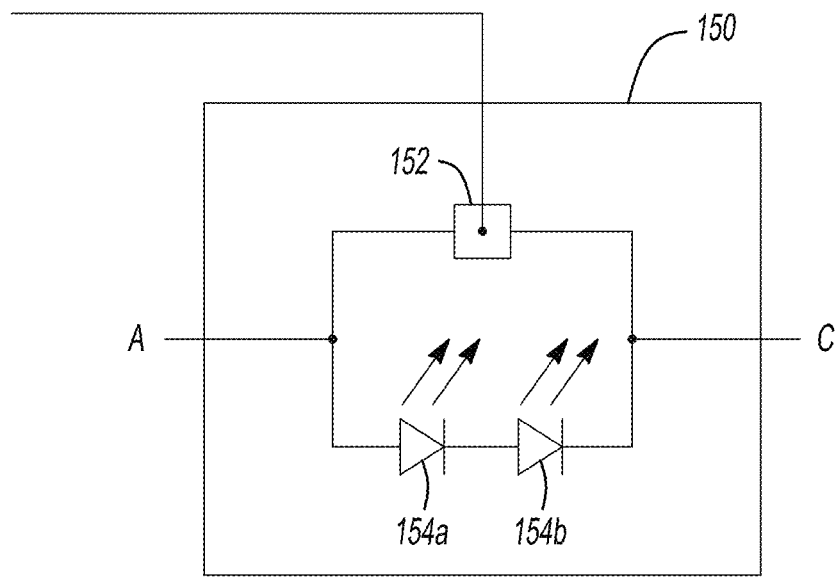
FIG. 4 illustrates a dual-light-emitting diode package in accordance with one or more embodiments of the platform.

FIG. 4 illustrates an example implementation of a dual-light-emitting diode (LED) package 150 in accordance with one or more embodiments of the platform 90. Each dual-LED package (or second package) 150 generally comprises an anode (A), a cathode (C), an electrostatic discharge device 152, and two light-emitting diodes 154a-154b. The two light-emitting diodes 154a and 154b may be electrically connected in series between the anode A and the cathode C. In some embodiments, both light-emitting diodes 154a and 154b may be implemented in a single die (or chip). In various embodiments, each light-emitting diode 154a and 154b may be implemented in a separate die (or chip). Therefore, the dual-LED second packages 150 may be referred to as two emitter die LED packages. The electrostatic discharge device 152 may be electrically connected between the anode A and the cathode C in parallel with the light-emitting diodes 154a-154b. In various embodiments, the second packages 150 of light-emitting diodes may be implemented with KW DPL832.K1 compact LED devices, available from OSRAM Opto Semiconductors GmbH.

Figure 5:
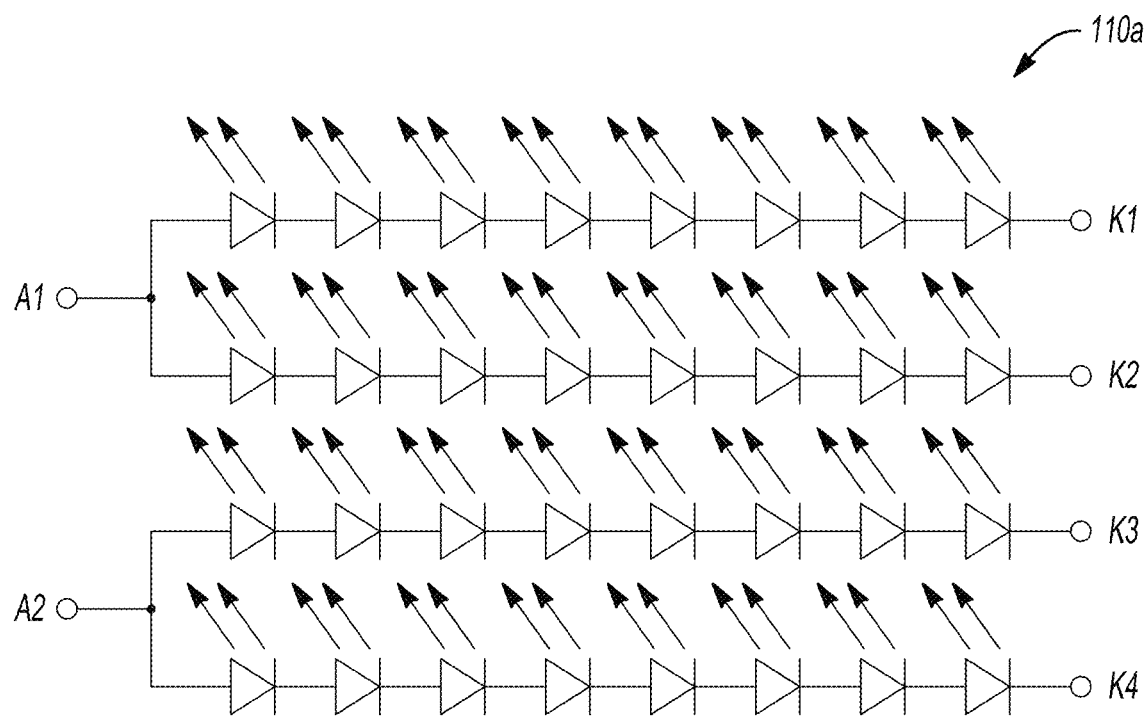
FIG. 5 illustrates a schematic diagram of a second light source in accordance with one or more embodiments of the platform.

FIG. 5 illustrates a schematic diagram of an example implementation of the second light source 110a in accordance with one or more embodiments of the platform 90. The implementation may be suitable for the first local-dimming display 100x having a 12.3 inch diagonal and 1920×720 pixels. The second light source 110a generally comprises several (e.g., 4) strings of multiple (e.g., 8) second packages 150 per string. Each string may have a separate cathode K1-K4. Pairs of the strings may share a common anode A1-A2. Each light-emitting diode symbols may represent two physical light-emitting diodes in a single package, so the second light source 110a may have a total of 64 light-emitting diodes. A total amount of power consumed may be a product of an anode-to-cathode voltage, a current through each string and the number of strings.

Figure 6:
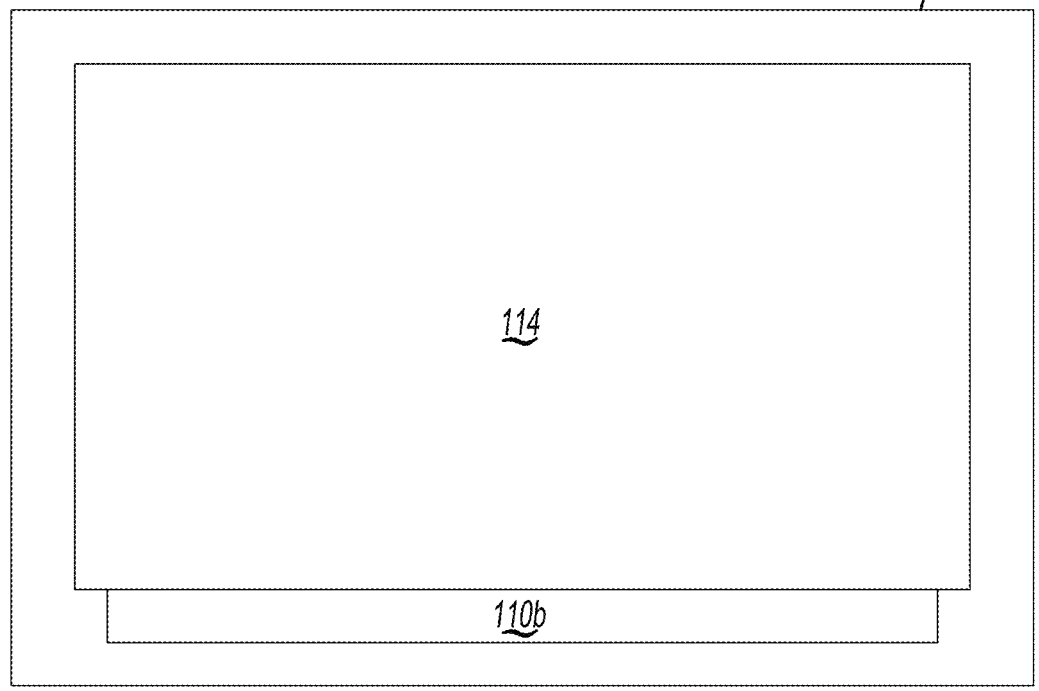
FIG. 6 illustrates a portion a second local-dimming display in accordance with one or more embodiments of the platform.

FIG. 6 illustrates an example implementation of a portion a second local-dimming display 100y in accordance with one or more embodiments of the platform 90. The portion generally comprises a third light source 110b and the backlight light pipe 114. The third light source 110b may be a variation of the light sources 110 and/or 110a.

The third light source 110b may be mounted along one side (e.g., a lower side as shown in the figure) of the backlight light pipe 114. The third light source 110b may comprise multiple (e.g., 48) first packages (or devices) positioned uniformly along the side facing the backlight light pipe 114. The first packages may generate the backlight that is projected into the backlight light pipe 114. The backlight light pipe 114 may be configured to distribute the backlight over an area facing the monochrome display 122.

Figure 7:
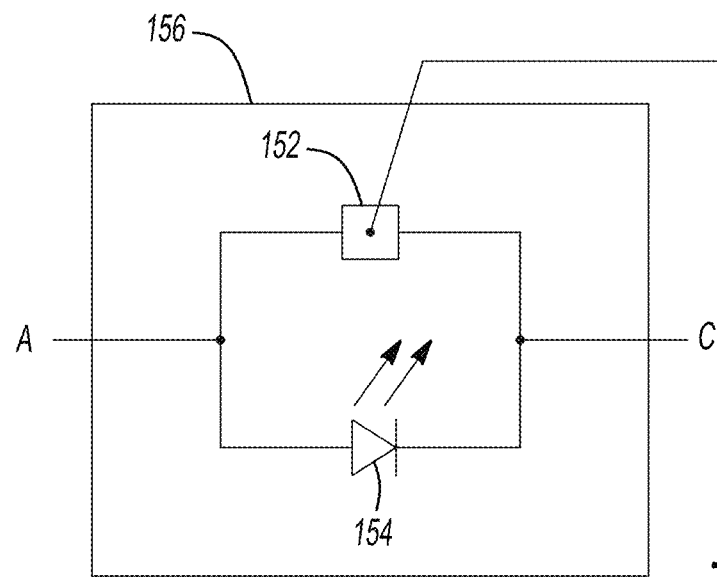
FIG. 7 illustrates a single-light-emitting diode package in accordance with one or more embodiments of the platform.

FIG. 7 illustrates an example implementation of a single-light-emitting diode package 156 in accordance with one or more embodiments of the platform 90. Each single-light-emitting diode package (or first package) 156 generally comprises the anode A, the cathode C, the electrostatic discharge device 152, and one light-emitting diode 154. The light-emitting diode 154 may be electrically connected between the anode A and the cathode C. In various embodiments, the light-emitting diode 154 may be implemented in an individual die (or chip). Therefore, the single-LED first packages 156 may be referred to as one emitter die LED packages. The electrostatic discharge device 152 may be electrically connected between the anode A and the cathode C in parallel with the light-emitting diode 154. In various embodiments, the first packages 156 of light-emitting diodes may be implemented with KW DPLS33.KD compact LED devices, available from OSRAM Opto Semiconductors GmbH. Other LED packages may be implemented to meet the design criteria of a particular application.

Figure 8:
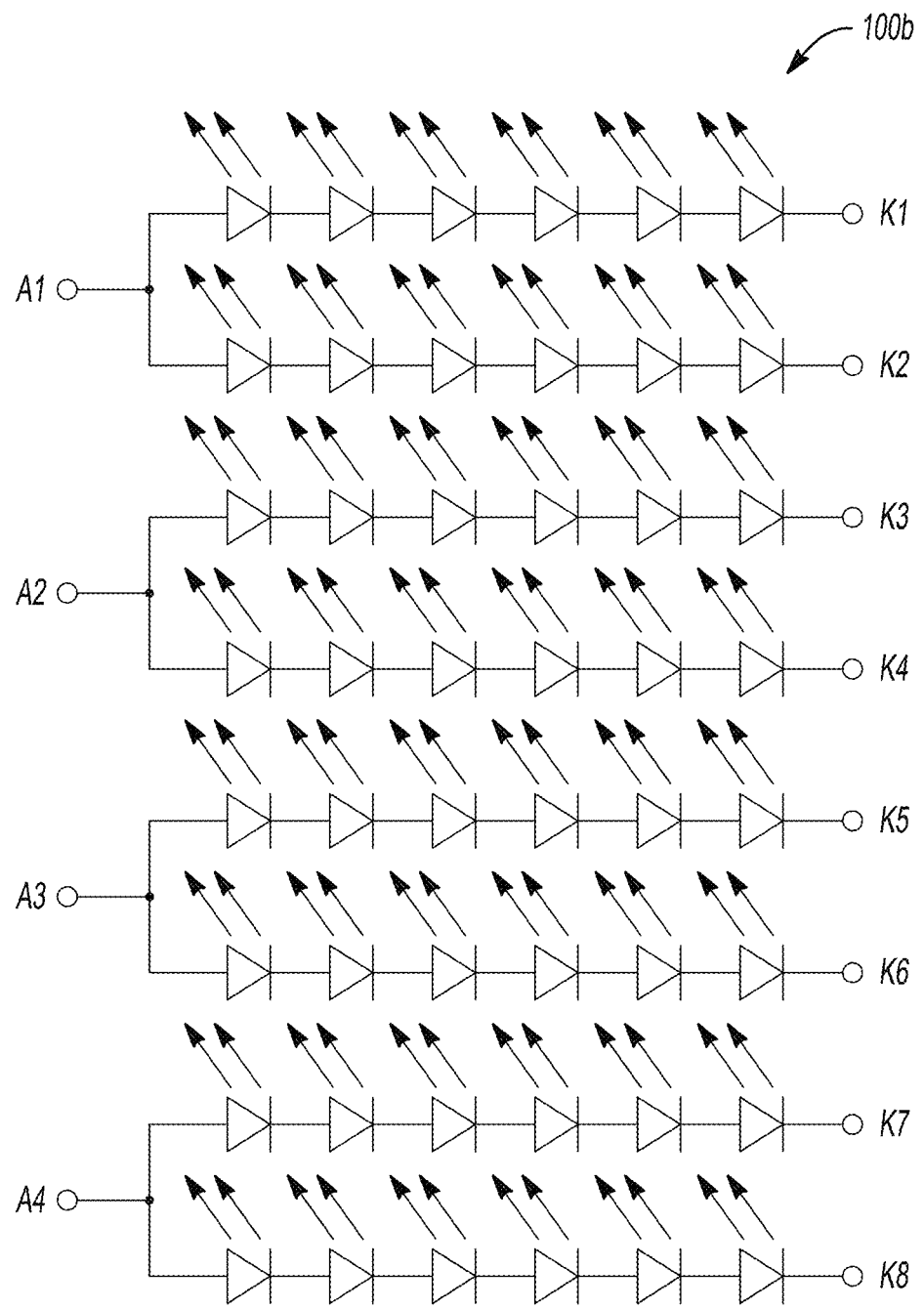
FIG. 8 illustrates a schematic diagram of the third light source in accordance with one or more embodiments of the platform.

FIG. 8 illustrates a schematic diagram of an example implementation of the third light source 110b in accordance with one or more embodiments of the platform 90. The implementation may be suitable for the second local-dimming display 100y having a 12.3 inch diagonal and 1920× 720 pixels. The third light source 110b generally comprises several (e.g., 8) strings of multiple (e.g., 6) first packages 156 per string. Each string may have a separate cathode K1-K4. Pairs of the strings may share a common anode A1-A2. Each light-emitting diode symbol may represent a single physical light-emitting diode so the third light source 110b may have a total of 48 light-emitting diodes. A power consumed by the third light source 110b may be a product of the anode-to-cathode voltage, a current in each string and the number of strings.

A physical size of the third light source 110b may match that of the second light source 110a. The current in each string of the third light source 110b may be larger than the current in each string of the second light source 110a. The anode-to-cathode voltage across the strings in the third light source 110b may be less than the anode-to-cathode voltage across the strings in the second light source 110a. The power consumed by the third light source 110b may be less than the power consumed by the second light source 110a at the same luminance output level.

A following analysis method may be applied to any display size. Displays having a 12.3 inch diagonal and 1920×720 pixel size may be widely utilized in automotive applications and so is used as a specific example. Generally, an operational luminance for a 12.3 inch diagonal display is specified at approximately 850 candela per square meter (e.g., $cd/m^2$). Due to transmission losses resulting from the use of the second package 150 configuration, about a second number (e.g., 30-32) of the second packages 150 (e.g., 60-64 light-emitting diodes) may be implemented in the second light source 110a in order to obtain the specified lumen output. The second packages 150 may be mounted on a backlight light-emitting diode flexible circuit strip within the second light source 110a and electrically interconnected per FIG. 5.

However, enough physical space is generally available along the side of the backlight light pipe 114 to mount a first number (e.g. 48) of the first packages 156 or the first number (e.g., 48) of the second packages 150 on the light-emitting diode flexible strip. Although the first number (48) of the first packages 156 in some light source designs is increased compared to the second number (32) of the second packages 150 interchangeable light source designs, a power consumed to operate the 48 first (single-LED) packages 156 is less than a power used to operate the 32 second (dual-LED) packages 150. The lower power consumption for the first packages 156 may be due to a higher electrical-to-optical conversion efficiency than for the second packages 150.

In various embodiments, 6 strings with 8 light-emitting diodes per string may be utilized. In other embodiments, 8 strings with 6 light-emitting diodes per string may be used so that a higher National Television System Committee (NTSC) triple BGB (blue-green-blue) light-emitting diode die/package may be utilized without exceeding a voltage rating (e.g., 50 volts) on a light-emitting diode flex connector. By using the largest (or maximum) number of light-emitting diodes, the power consumed per light-emitting diode is generally reduced which affords an improvement in efficiency. Other different light-emitting diode configurations and associated power may be implemented dependent on the color filter of the color display 130 and the light-emitting diodes used to obtain different NTSC ratios as shown in FIG. 7.

Color filters and light-emitting diode type power estimations are shown in Table I. A light-emitting diode (LED) Watts column in Table I is based on using a linear polarizer on the back of the monochrome display 122. The rightmost (last) column in Table I is based on a 25 percent improvement in efficiency when using a reflective polarizer (e.g., a reflective polarizer mirror (RPM) or a direct laminate reflective polarizer (DLRP)) on the back of the monochrome display 122, instead of the linear polarizer, and removing a dual brightness reflective polarizer (DBEF) in a backlight film stack. For the purposes of the analysis, 14.5 watts (W) is used as a reference. The term "nit" is a non-International System of Units name, where 1 nit=1 $cd/m^2$.

TABLE I

| Part number | LED Description | Color Filter Type | NTSC | LED watts | RPM or Linear Pol | RPM Est @ 75% (Watts) |
|---|---|---|---|---|---|---|
| | Osram KSF + Narrow Band Green Phosphor | "GOEM" | 84~85% | ~13 W Luminance 730 nit @ 32 ea LED | POL | 9.75 |
| NF2W257 HRT-HG | Nichia BB + KSF | | 80% min | ~13.5 850 nit | POL | 10.13 |
| NF2W257 HRT-HGB | Nichia BB + KSF + Narrow Band Green Phosphor | | 85% | ~14 W 850 nit | POL | 10.5 |

TABLE I-continued

| Part number | LED Description | Color Filter Type | NTSC | LED watts | RPM or Linear Pol | RPM Est @ 75% (Watts) |
|---|---|---|---|---|---|---|
| NF3W257 GRT-B2-C | Nichia BGB | | 93% | ~18 850 nit | POL | 13.5 |
| BF2W257 HRT-HGB | Nichia BB KSF + Narrow Band Green Phosphor | Optimized Color Filter | 98~103% | 17.5 W 850 nit | POL | 13.13 |
| | Osram KSF + Narrow Band Green Phosphor | | 98~103% | ~16.25 730 nit | POL | 12.19 |
| NF2W257 HRT-HG | Nichia BB + KSF | | 96% | ~16.8 850 nit | POL | 12.6 |
| HF3W257 GRT-B2-C | Nichia BGB | | 110% | ~22.5 850 nit | POL | 16.88 |

Figure 9:
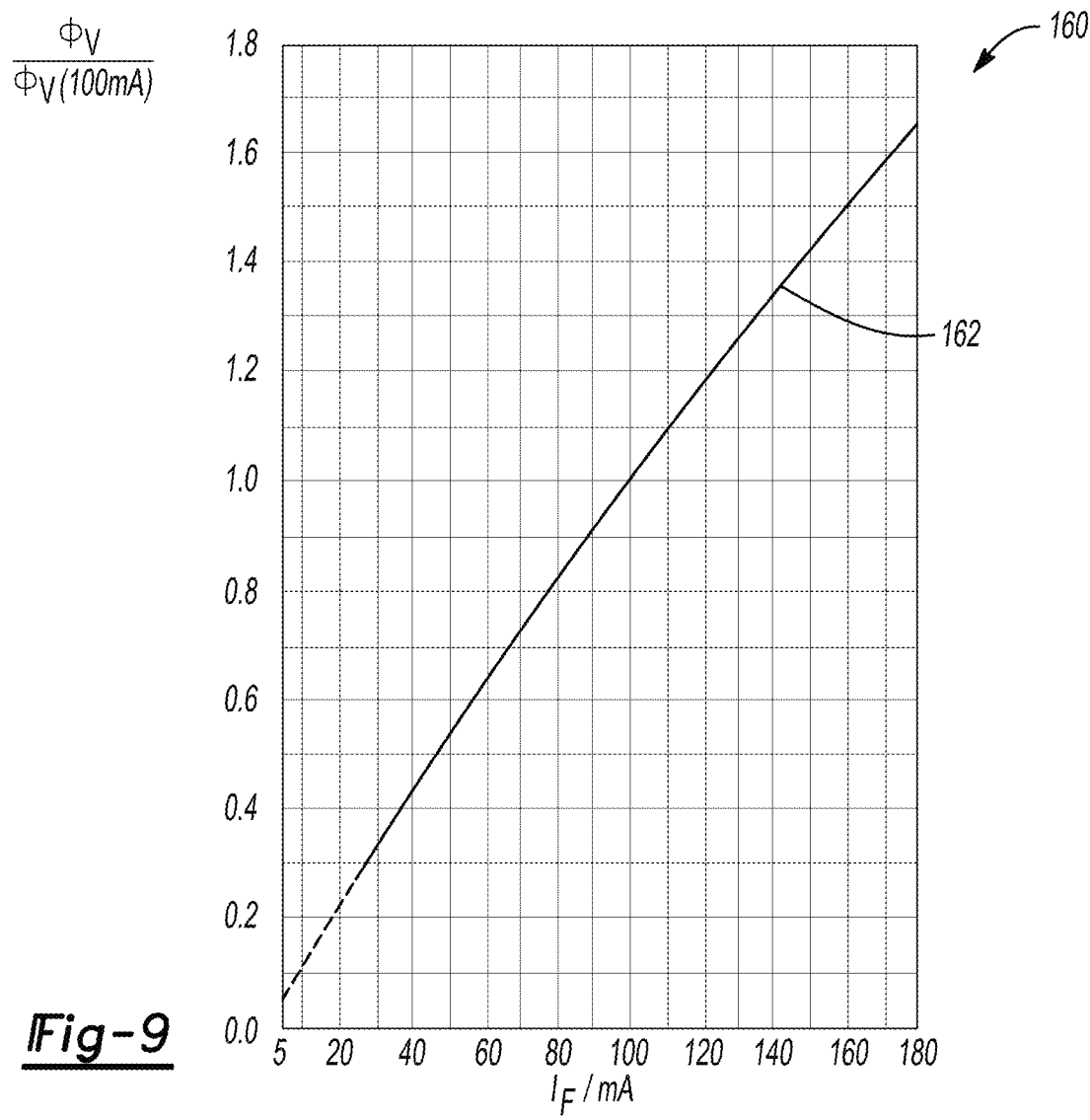
FIG. 9 illustrates a graph showing a relative luminous flux as a function of light-emitting diode current in accordance with one or more embodiments of the platform.

FIG. 9 illustrates a graph 160 showing a relative luminous flux as a function of light-emitting diode current in accordance with one or more embodiments of the platform 90. A curve 162 shows a relationship between the relative luminous flux (($\Phi_r/\Phi_v$) along the y-axis and a forward current ($I_F$) in milliamperes (mA) for the first packages 156 along the x-axis.

By operating each light-emitting diode in either the first packages 156 or the second packages 150 at a lower current level and by using more packages 156/150, the individual light-emitting diode efficiency is improved as shown by FIG. 9. Note that a slope of the curve 162 generally decreases as the light-emitting diode current is increased. The decrease in the slope may indicate that the efficiency is decreasing. The relative luminous flux may be expressed by formula 1 as follows:

$$\Phi_r/\Phi_r(100\ mA) = f(I_F); T_S = 25\ \text{degrees Celsius} \quad (1)$$

Where $f(I_F)$ is a function that describes the curve 162 and $T_S$ is a temperature of the substrate (or die or chip) of the light-emitting diodes in degrees Celsius (° C.).

Figure 10:
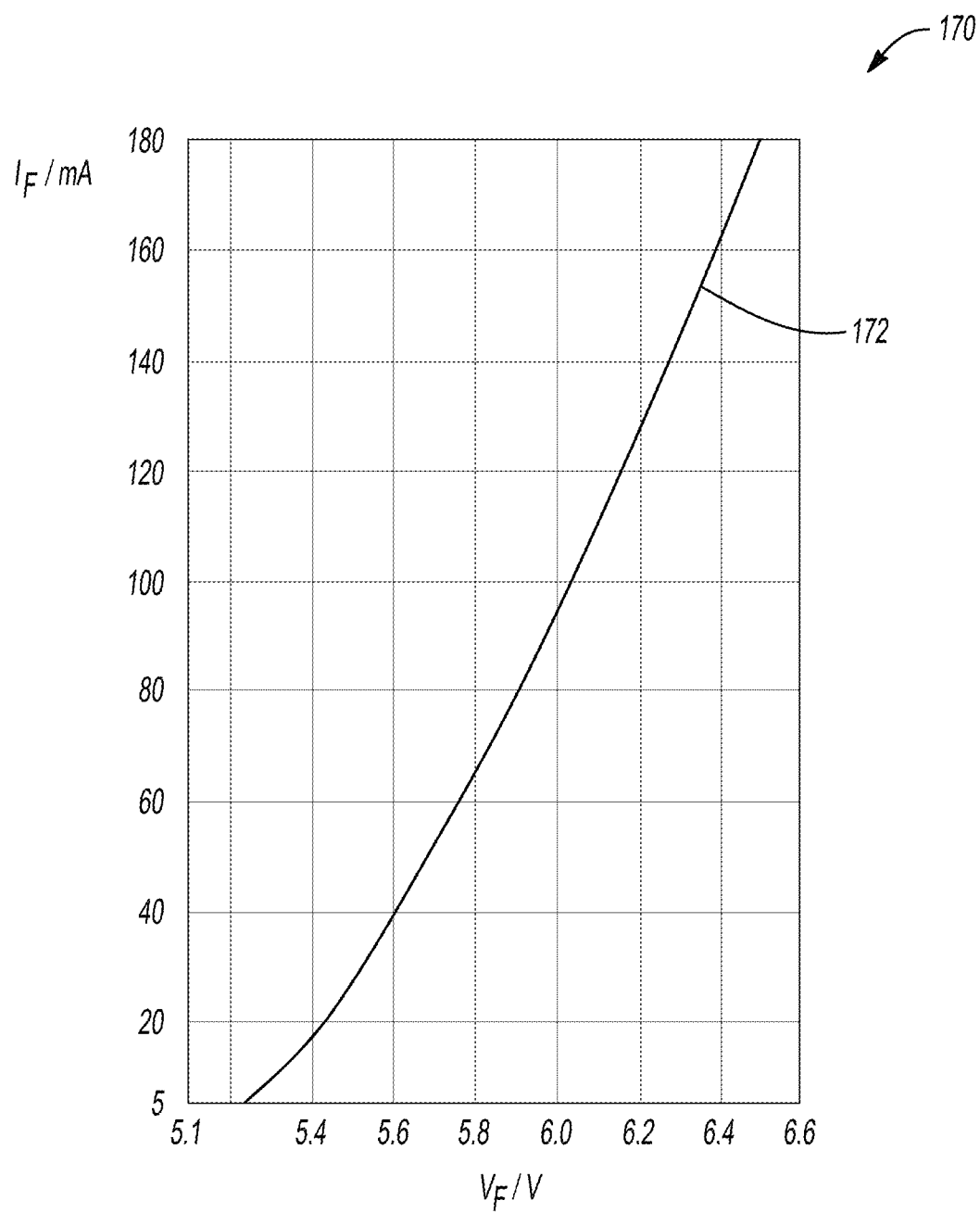
FIG. 10 illustrates a graph showing a forward voltage versus light-emitting diode current in accordance with one or more embodiments of the platform.

FIG. 10 illustrates a graph 170 showing a forward voltage versus light-emitting diode current in accordance with one or more embodiments of the platform 90. A curve 172 shows a relationship between the forward current $I_F$ along the y-axis and the forward voltage ($V_F$) along the x-axis.

When the light-emitting diodes are driven at different currents, a change in the forward voltage $V_F$ may be accounted for per FIG. 10. The forward current $I_F$ may be expressed per formula 2 as follows:

$$I_F = f(V_F); T_S = 25°\ C. \quad (2)$$

Where $f(V_F)$ is a function that describes the curve 172.

Multiple (e.g., two) methods may be utilized to analyze the efficiency: a constant power analysis; and a constant luminous analysis.

FIG. 11 illustrates a chart 180 of an example constant power analysis in accordance with one or more embodiments of the platform 90. In the chart 180, a left column contains an analysis of luminous efficiency at a constant power (e.g., 14.5 watts) for the first packages 156. A right column in the chart 180 contains an analysis of luminous efficiency for the second packages 150. A left arrow in the right column indicates that the value in the right column is the same as the corresponding value in the left column. Each column includes an analysis section for both a 32 package configuration and a 48 package configuration.

The bottom three rows of the chart 180 may illustrate that the total luminous flux generated by the 48 first packages 156 is greater than the total luminous flux generated by the 32 second packages 150. For the 48 first packages 156, the 48 light-emitting diodes create 8.4 percent more luminous flux (2,008 lumens (lm)) than the 32 light-emitting diodes (1,853 lumens) in the 32 first packages 156. For the 48 second packages 150, the 96 light-emitting diodes create 6.3 percent more luminous flux (1,916 lumens) than the 64 light-emitting diodes (1,802 lumens) in the 32 second packages 150.

The third-from-the-bottom row of the chart 180 generally shows that the first packages 156 may generate 2.8 percent more luminous flux (1,853 lumens) than the second packages 150 (1,802 lumens) in the 32 package configuration. The second-from-the-bottom row of the chart 180 shows that the first packages 156 may generate 4.8 percent more luminous flux (2,008 lumens) than the second packages 150 (1,916 lumens) in the 48 package configuration.

Comparing the luminous flux (1,802 lumens) generated by the 64 light-emitting diodes implemented with the 32 second packages 150 to luminous flux (2,008 lumens) generated by the 48 light-emitting diodes implemented with the 48 first packages 156 shows a 11.4 percent increase in the luminous flux for the 48 light-emitting diodes.

Figure 12:
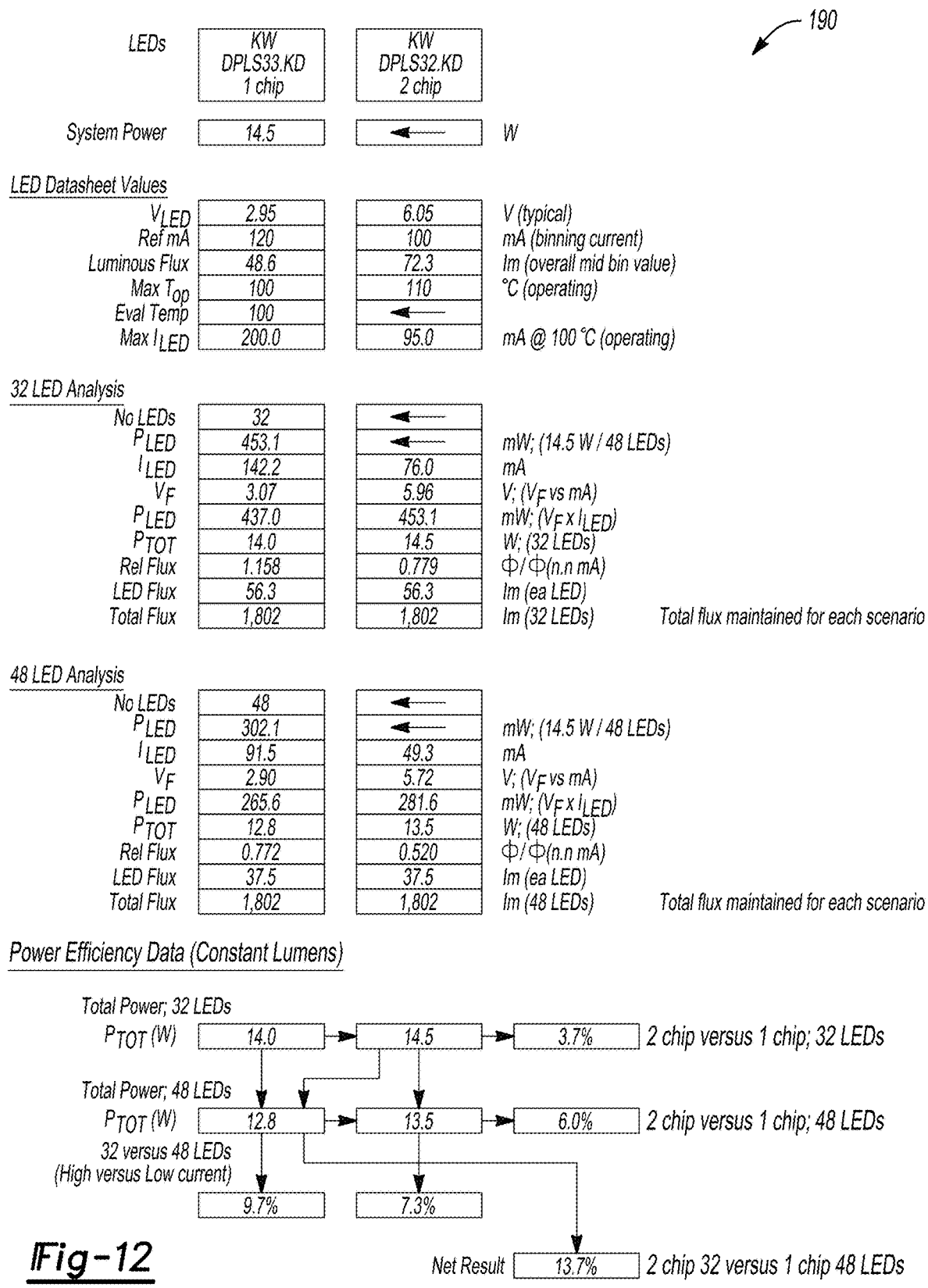
FIG. 12 illustrates a chart of a constant luminous analysis in accordance with one or more embodiments of the platform.

FIG. 12 illustrates a chart 190 of an example constant luminous analysis in accordance with one or more embodiments of the platform 90. In the chart 190, a left column contains an analysis of a power efficiency at a constant luminous flux (1,802 lumens) for the first packages 156. A right column in the chart 190 contains an analysis of a power efficiency for the second packages 150. A left arrow in the right column indicates that the value in the right column is the same as the corresponding value in the left column. Each column includes an analysis of both a 32 package configuration and a 48 package configuration.

The left column and the right column generally show that the electrical power consumed to generate the constant luminous flux decreases when more light-emitting diodes are implemented. The third-from-the-bottom row and the second-from-the-bottom row show that the power consumed to generate the constant luminous flux decreases by implementing the first packages 156 instead of the second packages 150.

Comparing the power consumption (14.0 watts) of the 32 light-emitting diodes implemented with the 32 first packages 156 to the power consumption (12.8 watts) of the 48 light-emitting diodes implemented with the 48 first packages 156 generally shows that the 48 light-emitting diodes consume less power than the 32 light-emitting diodes to achieve the same luminance. Comparing the power consumption (14.5 watts) of the 64 light-emitting diodes implemented with the 32 second packages 150 to the power consumption (13.5 watts) of the 96 light-emitting diodes implemented with the 48 second packages 150 generally shows that the 96 light-emitting diodes consume less power than the 64 light-emitting diodes to achieve the same luminance.

The power consumption of the first packages 156 (14.0 watts) is 3.7 percent more efficient than the power consumption of the second packages 150 (14.5 watts) in the 32 package configurations. The power consumption of the first packages 156 (12.8 watts) is 6.0 percent more efficient than the power consumption of the second packages 150 (13.5 watts) in the 48 package configurations. The 48 first packages 156 (12.8 watts) may consume 13.7 percent less power than the 32 second packages 150 (14.5 watts).

The chart 190 of the constant luminance analysis is generally preferred because the output luminance of the displays 100a-100c may be kept constant and the power consumed to keep the luminance constant for the various light-emitting diode configurations may vary. The chart 180 (FIG. 11) of the constant power analysis may determine the luminance changes while keeping the light-emitting diode power constant for the various light-emitting diode configurations.

From the chart 190, changing a design of the first light source 110 from 64 light-emitting diodes in 32 second packages 150 to 48 light-emitting diodes in the 48 first packages 156 may yield a 13.7 percent drop in power (e.g., approximately 1.7 watts) to achieve the same luminance. Table I shows the new power estimates in the last (rightmost) column if the 13.7 percent drop in power is obtained by changing the light-emitting diode configuration. Table II shows power estimates for the third light source 110b with 48 first packages 156.

TABLE II

| Part number | LED Description | Color Filter Type | NTSC | LED watts | RPM or Linear Pol | RPM Est @ 75% (Watts) | RPM Est @ 75% +13.7% decrease for 48 LEDs @ 1 die/ (Watts) |
|---|---|---|---|---|---|---|---|
| | Osram KSF + Narrow Band Green Phosphor | "GOEM" | 84~85% | ~13 W Luminance 730 nit @ 32 ea LED | POL | 9.75 | 8.414250 |
| NF2W257 HRT-HG | Nichia BB + KSF | | 80% min | ~13.5 850 nit | POL | 10.13 | 8.737875 |
| NF2W257 HRT-HGB | Nichia BB + KSF + Narrow Band Green Phosphor | | 85% | ~14 W 850 nit | POL | 10.5 | 9.0615 |
| NF3W257 GRT-B2-C | Nichia BGB | | 93% | ~18 850 nit | POL | 13.5 | 11.6505 |
| NF2W257 HRT-HGB | Nichia BB KSF + Narrow Band Green Phosphor | Optimized Color Filter | 98~103% | 17.5 W 850 nit | POL | 13.13 | 11.32688 |
| | Osram KSF + Narrow Band Green Phosphor | | 98~103% | ~16.25 730 nit | POL | 12.19 | 10.51781 |
| NF2W257 HRT-HG | Nichia BB + KSF | | 96% | ~16.8 850 nit | POL | 12.6 | 10.8738 |
| NF3W257 GRT-B2-C | Nichia BGB | | 110% | ~22.5 850 nit | POL | 16.88 | 14.56313 |

Table III shows power estimates for 24 second packages 150 (48 total light-emitting diodes).

TABLE III

| Part number | LED Description | Color Filter Type | NTSC | LED watts | RPM or Linear Pol | RPM Est @ 75% (Watts) | RPM Est @ 75% +7.3% decrease for 48 LEDs @ 2 die/ (Watts) |
|---|---|---|---|---|---|---|---|
| | Osram KSF + Narrow Band Green Phosphor | "GOEM" | 87~85% | ~13 W Luminance 730 nit @ 32 ea LED | POL | 9.75 | 9.03825 |

TABLE III-continued

| Part number | LED Description | Color Filter Type | NTSC | LED watts | RPM or Linear Pol | RPM Est @ 75% (Watts) | RPM Est @ 75% +7.3% decrease for 48 LEDs @ 2 die/ (Watts) |
|---|---|---|---|---|---|---|---|
| NF2W257 HRT-HG | Nichia BB + KSF | | 80% min | ~13.5 850 nit | POL | 10.13 | 9.385875 |
| NF2W257 HRT-HGB | Nichia BB + KSF + Narrow Band Green Phosphor | | 85% | ~14 W 850 nit | POL | 10.5 | 9.7335 |
| NF3W257 GRT-B2-C | Nichia BGB | | 93% | ~18 850 nit | POL | 13.5 | 12.5145 |
| NF2W257 HRT-HGB | Nichia BB KSF + Narrow Band Green Phosphor | Optimized Color Filter | 98-103% | 17.5 W 850 nit | POL | 13.13 | 12.16688 |
| | Osram KSF + Narrow Band Green Phosphor | | 98~103% | ~16.25 730 nit | POL | 12.19 | 11.29781 |
| NF2W257 HRT-HG | Nichia BB + KSF | | 96% | ~16.8 850 nit | POL | 12.6 | 11.6802 |
| NF3W257 GRT-B2-C | Nichia BGB | | 110% | ~22.5 850 nit | POL | 16.88 | 15.64313 |

Figure 13:
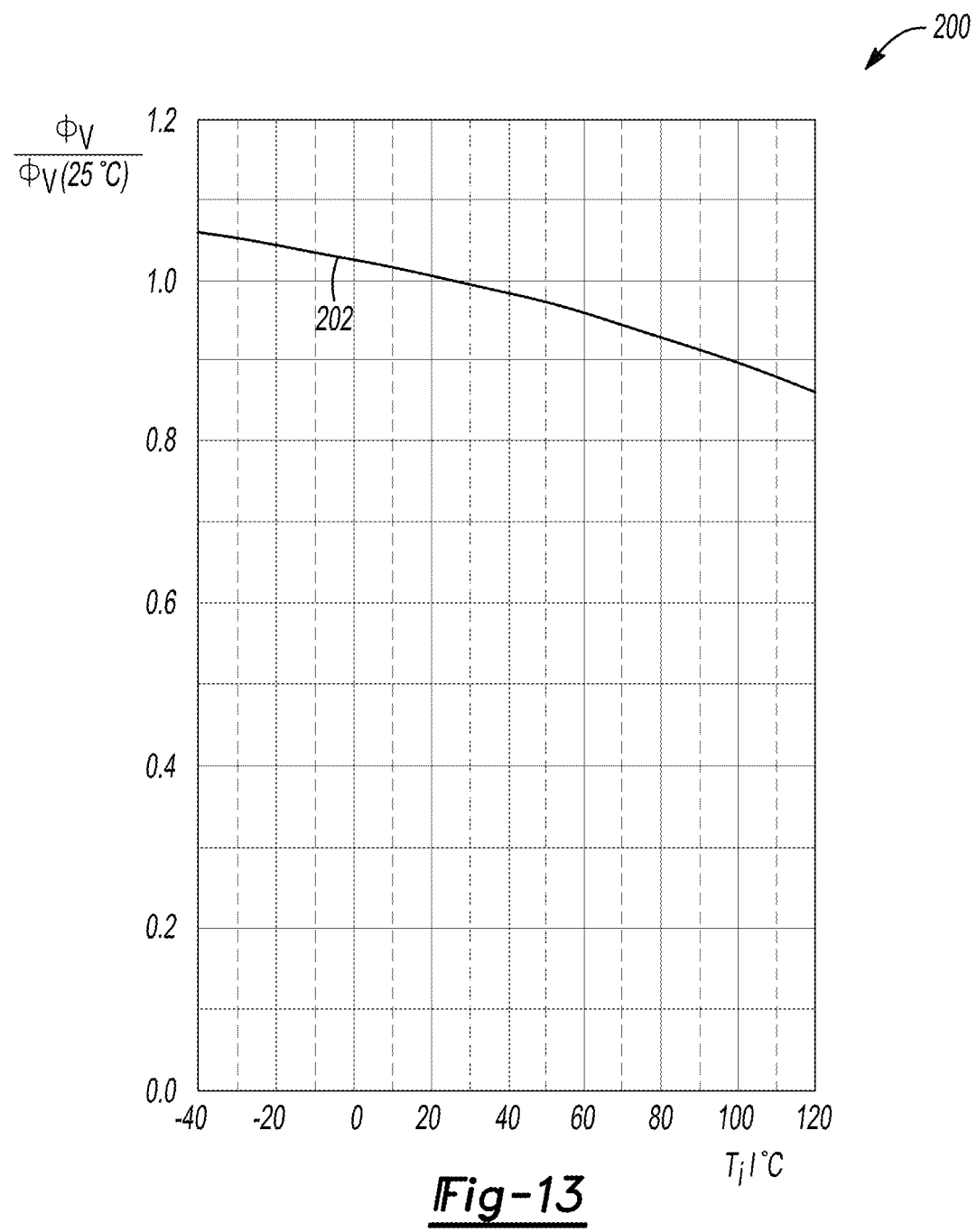
FIG. 13 illustrates a graph of a relative luminous flux decreasing as a light-emitting diode junction temperature increases in accordance with one or more embodiments of the platform.

FIG. 13 illustrates a graph 200 of an example relative luminous flux decreasing as a light-emitting diode junction temperature increases in accordance with one or more embodiments of the platform 90. A curve 202 generally illustrates the relative luminous flux (y-axis) as a function of the junction temperature (x-axis).

In addition to the power savings identified in the constant luminous analysis, changing from 32 second packages 150 to 48 first packages 156 may also result in additional power savings because the operational die temperature is reduced. At a 25° C. junction temperature ($T_j$), the relative luminous flux may be unity. At lower junction temperatures, the curve 202 shows that the relative luminous flux may increase. At higher junction temperatures, the curve 202 shows that the relative luminous flux decreases.

The relative luminous flux may be expressed by formula 3 as follows:

$$\Phi_r/\Phi_r(25° C.) = f(T_j); I_F = 100 \text{ mA} \quad (3)$$

Where $f(T_j)$ is a function that describes the curve 202.

Figure 14:
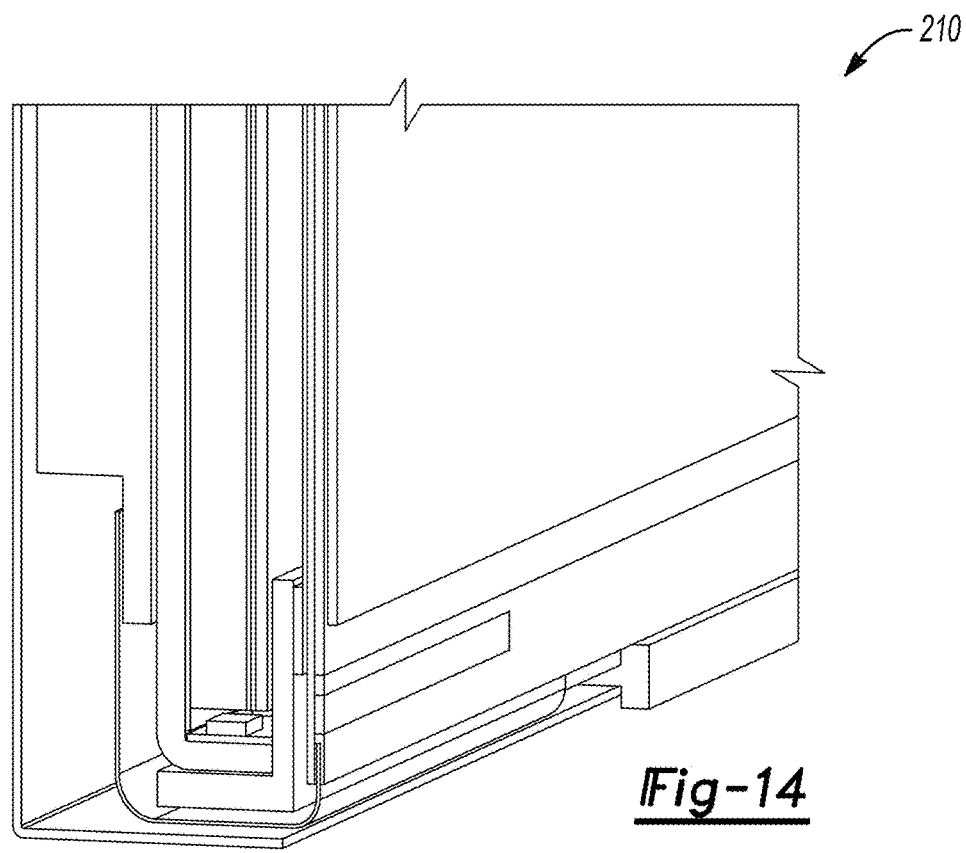
FIG. 14 illustrates an isometric view of a thermal model of a display in accordance with one or more embodiments of the platform.

FIG. 14 illustrates an isometric view of a thermal model 210 of a display (e.g., 100a-100c) in accordance with one or more embodiments of the platform 90. A thermal analysis was constructed to show how the junction temperature is decreased when the power is kept constant and the number of light-emitting diodes is increased. Two power cases were analyzed: 27 light-emitting diodes with 450 milliwatts (mW) per light-emitting diode for a total of 12.15 watts; and 40 light-emitting diodes with 304 mW per light-emitting diode for a total of 12.15 watts. The ambient temperature used in the thermal model 210 was 55° C.

Figure 15:
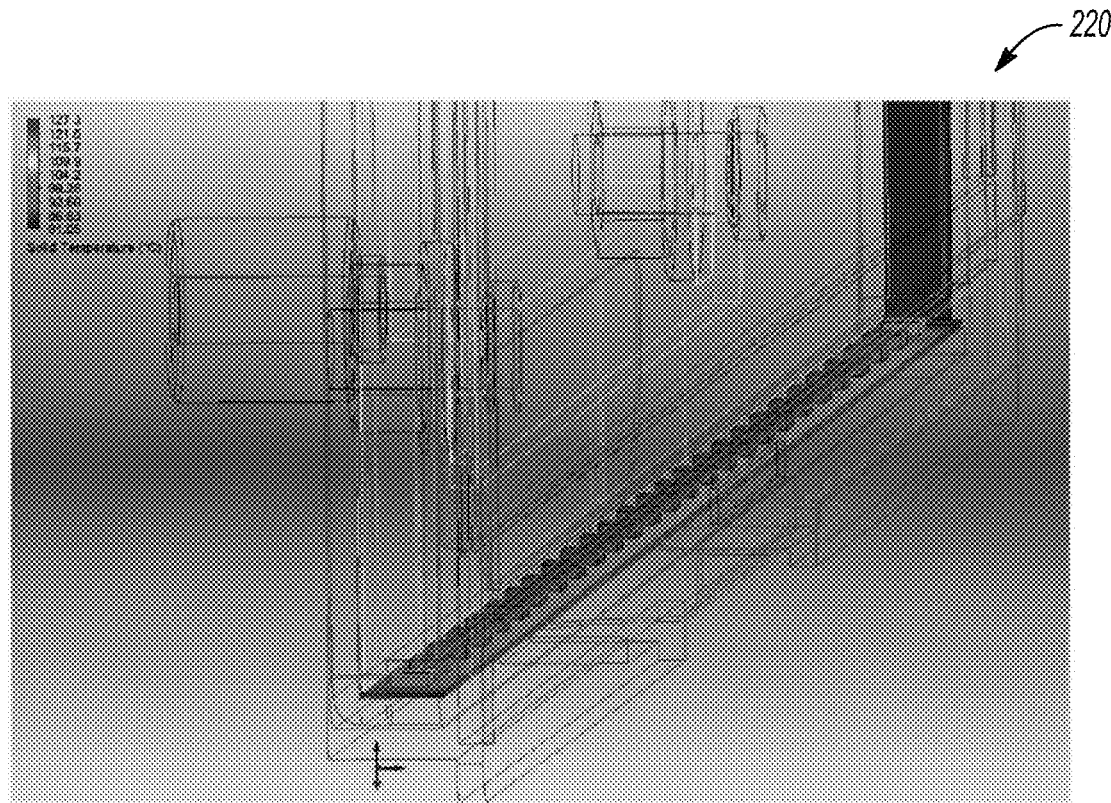
FIG. 15 illustrates a thermal simulation for a 27 light-emitting diode case in accordance with one or more embodiments of the platform.

FIG. 15 illustrates a thermal simulation 220 for the 27 light-emitting diode case in accordance with one or more embodiments of the platform 90. Powering the 27 light-emitting diodes simultaneously generally results in a light-emitting diode temperature of 127° C.

Figure 16:
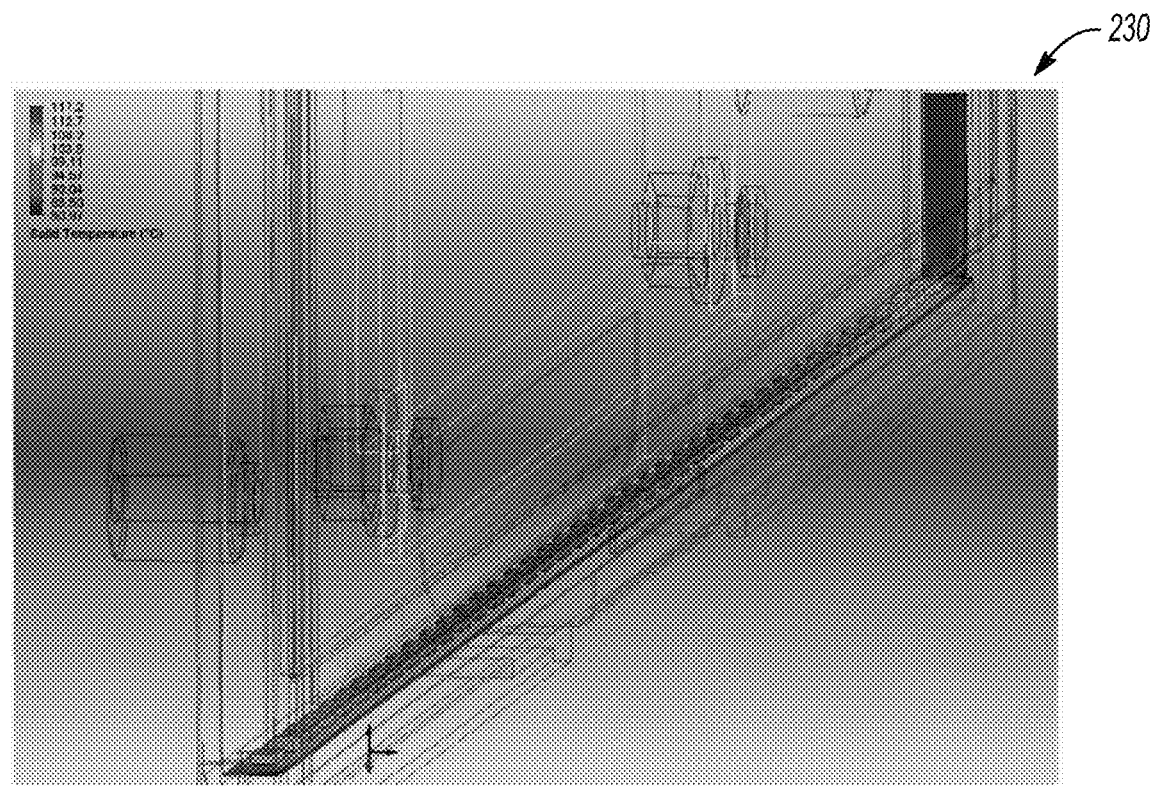
FIG. 16 illustrates a thermal simulation for a 40 light-emitting diode case in accordance with one or more embodiments of the platform.

FIG. 16 illustrates a thermal simulation 230 for the 40 light-emitting diode case in accordance with one or more embodiments of the platform 90. Powering the 40 light-emitting diodes simultaneously generally results in a light-emitting diode temperature of 117.2° C.

Figure 17:
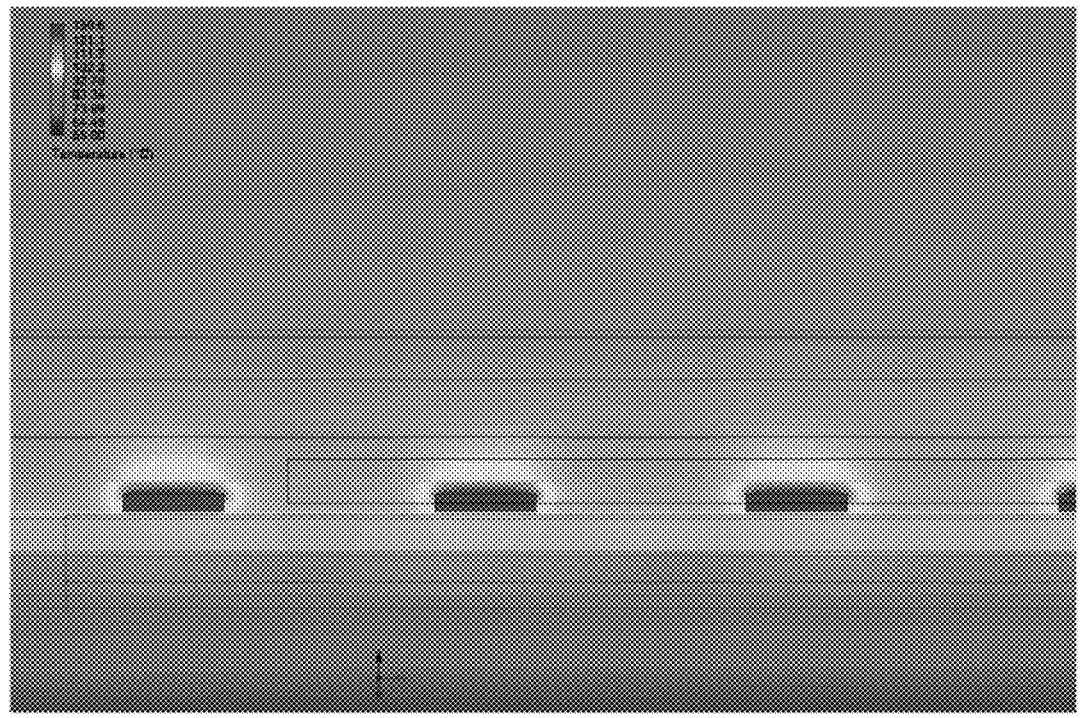
FIG. 17 illustrates another thermal simulation for the 27 light-emitting diode case in accordance with one or more embodiments of the platform.

FIG. 17 illustrates another thermal simulation 240 for the 27 light-emitting diode case in accordance with one or more embodiments of the platform 90. Powering the 27 light-emitting diodes simultaneously generally results in a light-emitting diode temperature of 130.6° C.

Figure 18:
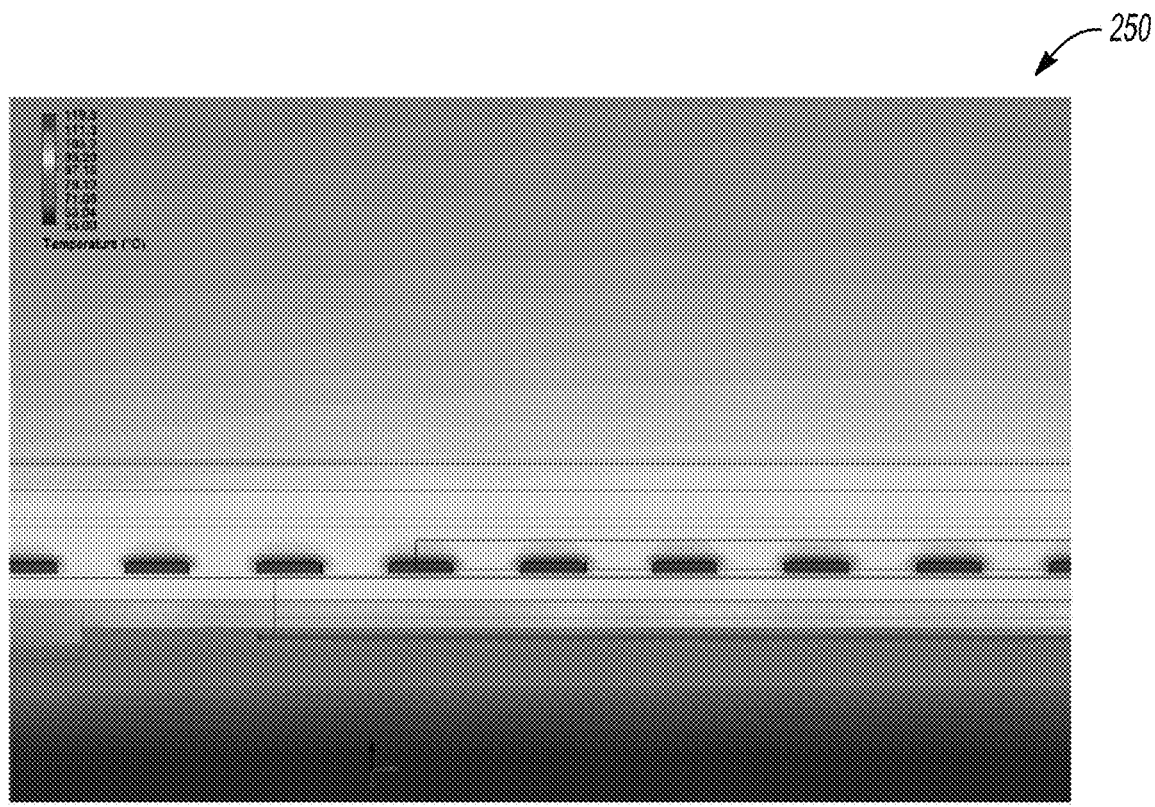
FIG. 18 illustrates another thermal simulation for the 40 light-emitting diode case in accordance with one or more embodiments of the platform.

FIG. 18 illustrates another thermal simulation 250 for the 40 light-emitting diode case in accordance with one or more embodiments of the platform 90. Powering the 40 light-emitting diodes simultaneously generally results in a light-emitting diode temperature of 119.3° C.

As illustrated in FIG. 15 through FIG. 18, a case temperature is generally lowered by about 10° C. when the 40 light-emitting diodes are used compared to the 27 light-emitting diodes. The lower case temperature should result in a junction temperature reduction by at least 10° C. If the junction temperature is lowered by about 10° C., the improvement in efficiency is about 3 percent from FIG. 14 that may be added to the previous improvement of 13.7 percent for a total improvement of 16.7 percent.

Table IV contains a power estimation for 48 light-emitting diodes in 48 first packages 156. The Table IV generally shows a power dissipation improvement in a rightmost (last) column, assuming a 16.7 percent improvement in efficiency.

TABLE IV

| Part number | LED Description | Color Filter Type | NTSC | LED watts | RPM or Linear Pol | RPM Est @ 75% (Watts) | RPM Est @ 75% +15.7% decrease for 48 LEDs @ 1 die/ (Watts) |
|---|---|---|---|---|---|---|---|
| | Osram KSF + Narrow Band Green Phosphor | "GOEM" | 94~85% | ~13 W Luminance 730 nit @ 32 ea LED | POL | 9.75 | 8.12175 |
| NF2W257 HRT-HG | Nichia BB + KSF | | 80% min | ~13.5 850 nit | POL | 10.13 | 8.434125 |
| NF2W257 HRT-HGB | Nichia BB + KSF + Narrow Band Green Phosphor | | 85% | ~14 W 850 nit | POL | 10.5 | 8.7465 |
| NF3W257 GRT-B2-C | Nichia BGB | | 93% | ~18 850 nit | POL | 13.5 | 11.2455 |
| NF2W257 HRT-HGB | Nichia BB KSF + Narrow Band Green Phosphor | | 98~103% | 17.5 W 850 nit | POL | 13.13 | 10.93313 |
| | Osram KSF + Narrow Band Green Phosphor | Optimized Color Filter | 98~103% | ~16.25 730 nit | POL | 12.19 | 10.15219 |
| NF2W257 HRT-HG | Nichia BB + KSF | | 96% | ~16.8 850 nit | POL | 12.6 | 10.4958 |
| NF3W257 RT-B2-C | Nichia BGB | | 110% | ~22.5 850 nit | POL | 16.88 | 14.05688 |

Table V contains power estimates for 48 light-emitting diodes in 24 second packages 150. The values in the table generally show a power dissipation improvement in a rightmost (last) column, assuming with a 10.7 percent efficiency improvement.

TABLE V

| Part number | LED Description | Color Filter Type | NTSC | LED watts | RPM or Linear Pol | RPM Est @ 75% (Watts) | RPM Est @ 75% +10.3% decrease for 48 LEDs @ 2 die/ (Watts) |
|---|---|---|---|---|---|---|---|
| | Osram KSF + Narrow Band Green Phosphor | "GOEM" | 84~85% | ~13 W Luminance 730 nit @ 32 ea LED | POL | 9.75 | 8.74575 |
| NF2W257 HRT-HG | Nichia BB + KSF | | 80% min | ~13.5 850 nit | POL | 10.13 | 9.082125 |
| NF2W257 HRT-HGB | Nichia BB + KSF + Narrow Band Green Phosphor | | 85% | ~14 W 850 nit | POL | 10.5 | 9.4185 |
| NF3W257 GRT-B2-C | Nichia BGB | | 93% | ~18 850 nit | POL | 13.5 | 12.1095 |
| NF2W257 GRT-HGB | Nichia BB KSF + Narrow Band Green Phosphor | Optimized Color Filter | 98~103% | 17.5 W 850 nit | POL | 13.13 | 11.77313 |

TABLE V-continued

| Part number | LED Description | Color Filter Type | NTSC | LED watts | RPM or Linear Pol | RPM Est @ 75% (Watts) | RPM Est @ 75% +10.3% decrease for 48 LEDs @ 2 die/ (Watts) |
|---|---|---|---|---|---|---|---|
| | Osram KSF + Narrow Band Green Phosphor | | 98~103% | ~16.25 730 nit | POL | 12.19 | 10.93219 |
| HF2W257 HRT-HG | Nichia BB + KSF | | 96% | ~16.8 850 nit | POL | 12.6 | 11.3022 |
| NF3W257 GRT-B2-C | Nichia BGB | | 110% | ~22.5 850 nit | POL | 16.88 | 15.13688 |

Table IV and Table V generally highlights that the first packages 156 may obtain additional efficiency improvements compared to the second packages 150.

Another way of looking at the thermal aspects is to assume that solder point temperatures (in units of Kelvin (K)) are the same between the 27 light-emitting diode configuration and the 40 light-emitting diode configuration. If a typical electrical thermal resistance (e.g., 11 K/W) is used, a junction temperature difference (Δ) may be determined by formula 4 (27 light-emitting diodes) and formula 5 (40 light-emitting diodes) as follows:

$$11 \text{ K/W} \times \Delta 0.453 \text{ W} = \Delta 5K = \Delta 5° \text{ C}. \quad (4)$$

$$11 \text{ K/W} \times \Delta 0.302 \text{ W} = \Delta 3.3K = \Delta 3.3° \text{ C}. \quad (5)$$

The electrical thermal resistance results show that a small efficiency improvement may be realized.

An aspect of operating the light-emitting diodes at a lower current is that the color temperature may be affected. Table VI contains an example optical specification. Values in the table generally shown that the "white" chromaticity parameter is typically "greenish" (e.g., $(X_W, Y_W) = (0.321, 0.371)$). Chromaticity is generally specified as a hue parameter and a colorfulness parameter.

TABLE VI

| Parameter | | Symbol | Condition | Min. | Typ. | Max. | Unity | Remark |
|---|---|---|---|---|---|---|---|---|
| Viewing Angle Range | Horizontal | $\Theta_3$ | CR > 10 | 80 | 85 | — | Deg. | Note 1 |
| | | $\Theta_9$ | | 80 | 85 | — | Deg. | |
| | Vertical | $\Theta_{12}$ | | 80 | 85 | — | Deg. | |
| | | $\Theta_6$ | | 80 | 85 | — | Deg. | |
| Contrast ratio | | CR | $\Theta = 0°$ (Center) Normal | 10000 | | — | | With DLRP or RPM see FIG. 4-5 |
| White luminance uniformity | | ΔY | Viewing Angle | 70 | 80 | | % | Note 4 |
| NTSC | | % | | 90% | 93% | | | |
| Whit Chromaticity | | $x_w$ | | Typ −0.04 | 0.321 0.371 | Typ +0.04 | — | Update by first Sample Will adjust white coordinate through LED |
| | | $y_w$ | | | | | — | |
| Reproduction of color | Red | $x_R$ | | | 0.675 | | — | |
| | | $y_R$ | | | 0.322 | | — | |
| | Green | $x_G$ | | | 0.265 | | — | |
| | | $y_G$ | | | 0.691 | | — | |
| | Blue | $x_B$ | | | 0.148 | | — | |
| | | $y_B$ | | | 0.080 | | — | |
| Response Time (Rising/Falling) | | $T_{RT}$ | 25° C. −20° C. | — | — | 35 200 | ms | Note 6 |
| BLU Derating | | T | 64° C. | — | — | 30% | | F 5-4 |

Figure 19:
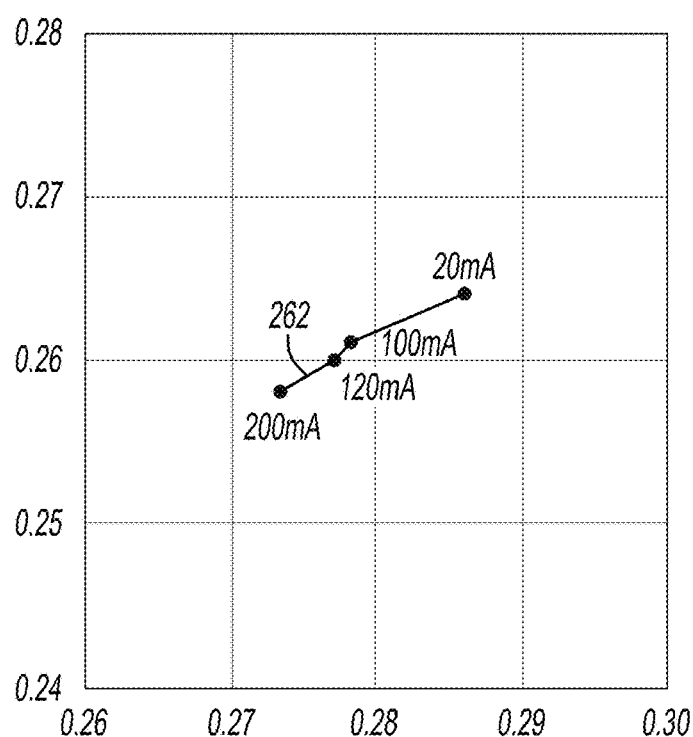
FIG. 19 illustrates a graph of chromaticity coordinates as a function of drive current in accordance with one or more embodiments of the platform.

FIG. 19 illustrates an example graph 260 of chromaticity coordinates as a function of drive current in accordance with one or more embodiments of the platform 90. Points on the graph 260 were measured at an ambient temperature of $T_A=°$ C. A curve 262 through the measured points generally show a green shift in the chromaticity as the drive current increases from 20 mA to 200 mA. Operating the light-emitting diodes at lower currents (e.g., approximately 50 mA instead of 200 mA) may cause additional shifts toward green (e.g., (Δx, Δy)=(0.01, 0.005)) as shown by the curve 262.

Figure 20:
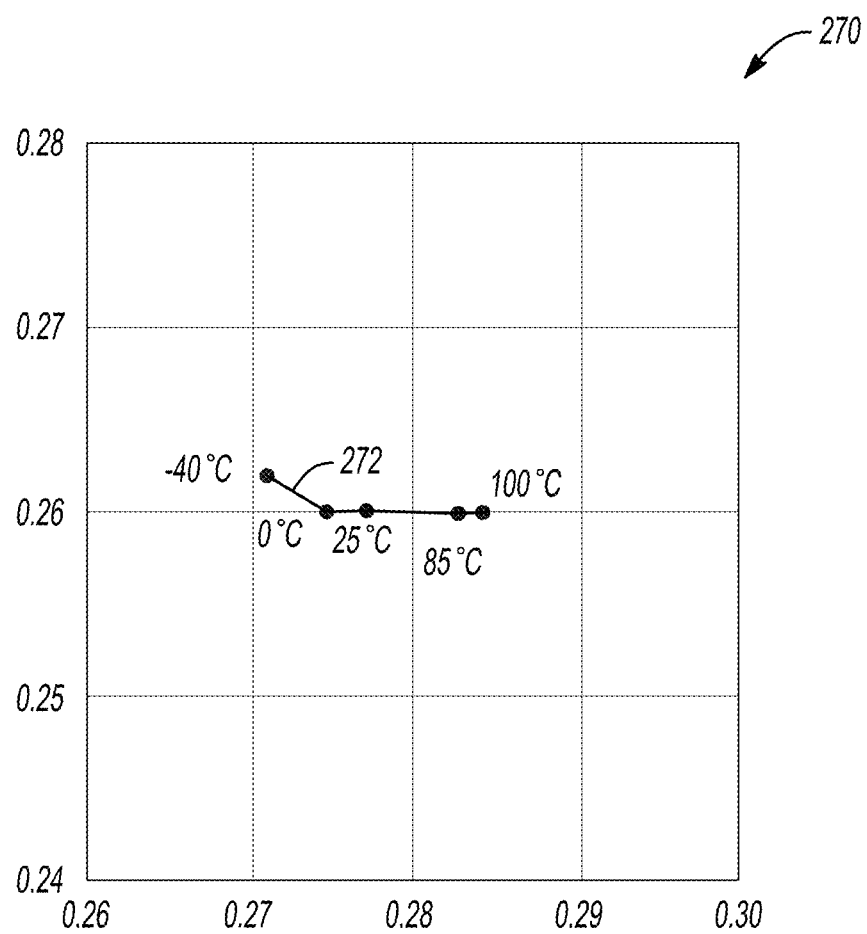
FIG. 20 illustrates a graph of the chromaticity coordinates as a function of ambient temperature in accordance with one or more embodiments of the platform.

FIG. 20 illustrates an example graph 270 of the chromaticity coordinates as a function of ambient temperature in accordance with one or more embodiments of the platform 90. Points on the graph 270 were measured at a predetermined forward pulse current (e.g., $I_{FP}$=120 mA). A curve 272 through the points generally show a negative Δx shift in the chromaticity as the temperature decreases from 100° C. to −40° C.

Some mitigation of the positive Δx shift due to lower currents, as illustrate by the curve 262 (FIG. 19), may occur by operating the junctions of the light-emitting diodes at a lower temperature. As may be seen in the curve 272, the Δx shift goes down as the temperature is decreased. Also, it has been discovered that the use of an RPM polarizer, instead of a linear polarizer, generally shifts the color coordinate by (−0.0035, −0.0085). Therefore, most of the color shift of going to the lower current is negated by use of the RPM polarizer and the lower temperature operation.

Figure 21:
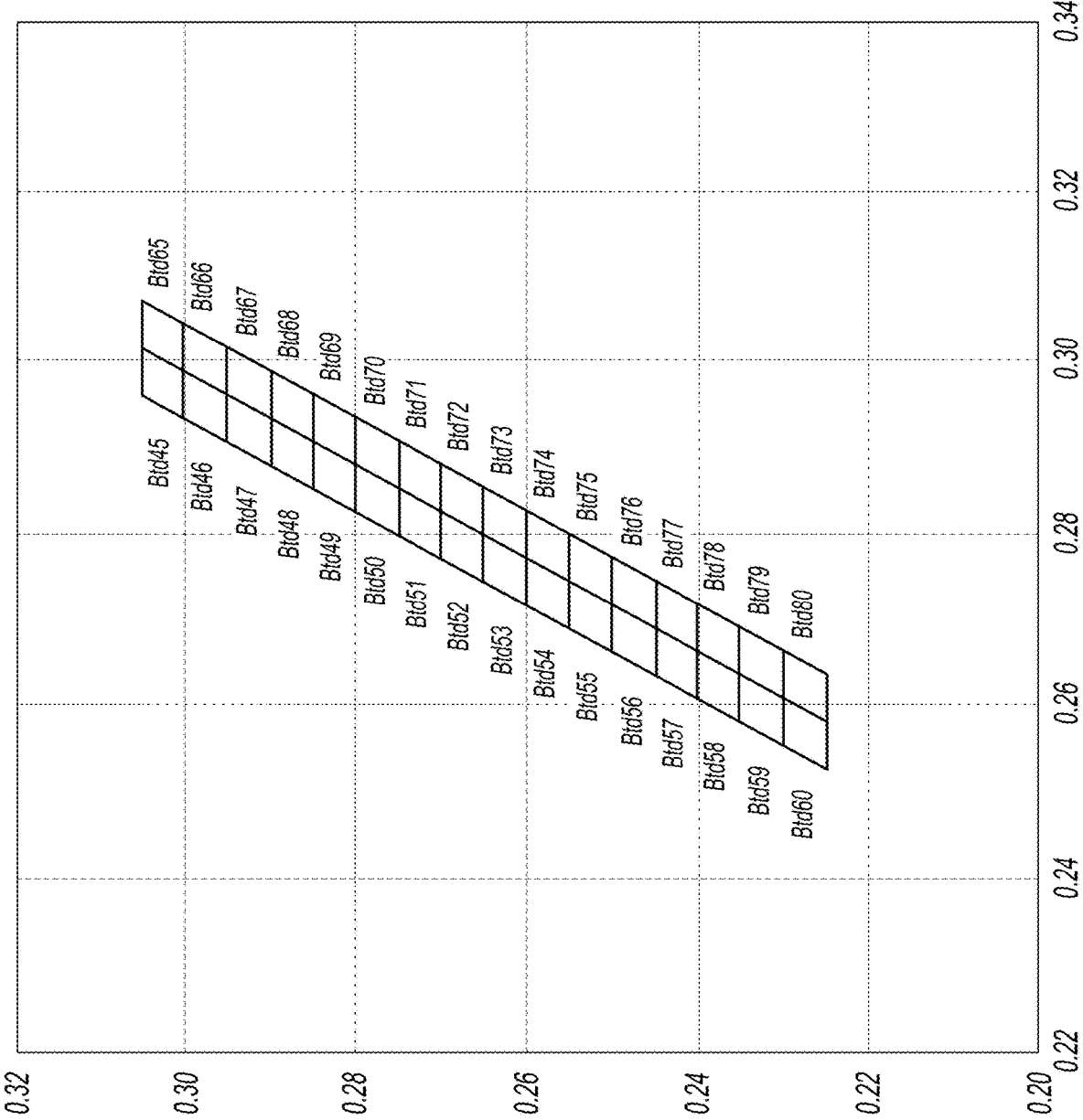
FIG. 21 illustrates a graph of a chromaticity diagram in accordance with one or more embodiments of the platform.

FIG. 21 illustrates an example graph 280 of a chromaticity diagram in accordance with one or more embodiments of the platform 90. The graph 280 includes multiple color bins or ranks (Btd45-Btd80) for commercially available light-emitting diodes. Appropriate selection of a color bin Btd45-Btd80 may aid in offsetting the color shifts caused by the lower drive current. In various embodiments, the light-emitting diodes may be STS-DA1-5493 devices available from Nichia Corporation.

The color temperature analysis generally show that implementing an uncommonly higher first number (e.g., 48) of the first packages 156, instead of a regular second number (e.g., 32) of the second packages 150, and operating the first packages 156 at a higher current (e.g., around 100 mA) may shift the color temperature towards blue. By changing from the second light source 110*a* with 32 second packages 150 to the third light source 110*b* with 48 first packages 156 generally reduces the power dissipation by approximately several (e.g., 2.2) watts at a particular luminance. Furthermore, the third light source 110*b* may have an improved color temperature due to the higher currents that the individual light-emitting diodes may be driven at. If 48 of the second packages 150 are implemented instead of 32 of the second packages 150, the power savings may be 1.36 Watts with a change in the white color point due to the lower current drive.

The foregoing detailed description and the drawings are supportive and descriptive of the disclosure, but the scope of the disclosure is defined solely by the claims. As will be appreciated by those of ordinary skill in the art, various alternative designs and embodiments may exist for practicing the disclosure.

The invention claimed is:

1. A display system comprising:
   a light source having an available space and configured to generate a backlight;
   a first display aligned with the light source and having a plurality of first pixels, wherein each of the plurality of first pixels is configured to selectively pass and block the backlight; and
   a second display aligned with the first display and having a plurality of second pixels, wherein:
   the light source comprises a first number of first packages each having a single light-emitting diode, the first number is a largest number of the first packages that fit in the available space of the light source, and the first number of the first packages is configured to consume a first power to produce a particular luminance;
   a second number of second packages each having two light-emitting diodes alternatively fit in the available space of the light source and is configured to consume a second power to produce the particular luminance;
   the first number is greater than the second number; and
   the first power is less than the second power.

2. The display system according to claim 1, further comprising a backlight light pipe configured to distribute the backlight received from the light source to the first display.

3. The display system according to claim 2, wherein the light source is configured to present the backlight to a single side of the backlight light pipe.

4. The display system according to claim 1, wherein the first packages are arranged in a plurality of first strings, and the second packages are arranged in a plurality of second strings.

5. The display system according to claim 4, wherein each of the plurality of first strings is configured to use a first current and each of the plurality of second strings is configured to use a second current, wherein the first current is greater than the second current.

6. The display system according to claim 4, wherein each of the plurality of first strings is configured to yield a first voltage and each of the plurality of second strings is configured to yield a second voltage, wherein the first voltage is less than the second voltage.

7. The display system according to claim 1, wherein at the particular luminance, each of the first packages is configured to yield a first junction temperature, and each of the second packages is configured to yield a second junction temperature, wherein the first junction temperature is lower than the second junction temperature.

8. The display system according to claim 7, wherein the first number of first packages is configured to increase an efficiency of the first packages as the first junction temperature decreases.

9. The display system according to claim 1, wherein the first display is a monochrome display and the plurality of first pixels are a plurality of monochrome pixels.

10. The display system according to claim 1, wherein the second display is a color display and the plurality of second pixels are a plurality of color pixels.

11. An instrument panel comprising:
    an electronic control unit; and
    a plurality of displays in electrical communication with the electronic control unit, wherein one or more of the plurality of displays includes:
    a light source having an available space and configured to generate a backlight;
    a monochrome display aligned with the light source and having a plurality of monochrome pixels, wherein each of the plurality of monochrome pixels is configured to selectively pass and block the backlight; and
    a color display aligned with the monochrome display and having a plurality of color pixels, wherein:
    the light source comprises a first number of first packages each having a single light-emitting diode, the first number is a largest number of the first packages that fit in the available space of the light source, and the first number of the first packages is configured to consume a first power to produce a particular luminance;
    a second number of second packages each having two light-emitting diodes alternatively fit in the available space of the light source and is configured to consume a second power to produce the particular luminance;
    the first number is greater than the second number; and
    the first power is less than the second power.

12. The instrument panel according to claim 11, wherein the one or more of the plurality of displays includes a backlight light pipe configured to distribute the backlight received from the light source to the monochrome display.

13. The instrument panel according to claim 12, wherein the light source is configured to present the backlight to a single side of the backlight light pipe.

14. The instrument panel according to claim 11, wherein the first packages are arranged in a plurality of first strings, and the second packages are arranged in a plurality of second strings.

15. The instrument panel according to claim 14, wherein each of the plurality of first strings is configured to use a first current and each of the plurality of second strings is configured to use a second current, wherein the first current is greater than the second current.

16. The instrument panel according to claim 14, wherein each of the plurality of first strings is configured to yield a first voltage and each of the plurality of second strings is configured to yield a second voltage, wherein the first voltage is less than the second voltage across.

17. The instrument panel according to claim 11, wherein at the particular luminance, each of the first packages is configured to yield a first junction temperature, and each of the second packages is configured to yield a second junction temperature, wherein the first junction temperature is lower than the second junction temperature.

18. The instrument panel according to claim 17, wherein the first number of first packages is configured to increase an efficiency of the first packages as the first junction temperature decreases.

19. The instrument panel according to claim 11, wherein the electronic control unit and the plurality of displays are mountable in a vehicle.

20. A display system comprising:
a light source having an available space and configured to generate a backlight;
a backlight light pipe configured to distribute the backlight received from the light source;
a display aligned with the backlight light pipe and configured to transmit the backlight received from the backlight light pipe;
a first number of first packages each having a single light-emitting diode and is configured to consume a first power to produce a particular luminance; and
a second number of second packages each having two light-emitting diodes and is configured to consume a second power to produce the particular luminance, wherein:
the second number of second packages is replaced by the first number of first packages in the available space of the light source;
the first number is greater than the second number; and
the first power is less than the second power.

* * * * *